(12) United States Patent
Yamazaki et al.

(10) Patent No.: US 8,970,999 B2
(45) Date of Patent: Mar. 3, 2015

(54) DRIVER CIRCUIT, METHOD OF MANUFACTURING THE DRIVER CIRCUIT, AND DISPLAY DEVICE INCLUDING THE DRIVER CIRCUIT

(71) Applicant: Semiconductor Energy Laboratory Co., Ltd., Atsugi-shi, Kanagawa-ken (JP)

(72) Inventors: Shunpei Yamazaki, Setagaya (JP); Jun Koyama, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/199,377

(22) Filed: Mar. 6, 2014

(65) Prior Publication Data

US 2014/0185170 A1    Jul. 3, 2014

Related U.S. Application Data

(62) Division of application No. 13/529,120, filed on Jun. 21, 2012, now Pat. No. 8,673,426.

(30) Foreign Application Priority Data

Jun. 29, 2011    (JP) ................. 2011-144836

(51) Int. Cl.
*H02H 9/00* (2006.01)
*H02H 9/04* (2006.01)
(Continued)

(52) U.S. Cl.
CPC ............ *H02H 9/044* (2013.01); *G09G 3/3283* (2013.01); *G09G 3/3688* (2013.01); *G11C 19/28* (2013.01);
(Continued)

(58) Field of Classification Search
USPC ..................................... 361/56, 21
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 0981157 A | 2/2000 |
| EP | 1737044 A | 12/2006 |

(Continued)

OTHER PUBLICATIONS

Morosawa.N et al., "35.3: Distinguished Paper: A Novel Self-Aligned Top-Gate Oxide TFT for AM-OLED Displays", SID Digest '11 : SID International Symposium Digest of Technical Papers, May 17, 2011, pp. 479-482.

(Continued)

*Primary Examiner* — Adam Houston
(74) *Attorney, Agent, or Firm* — Eric J. Robinson; Robinson Intellectual Property Law Office, P.C.

(57) ABSTRACT

Provided are a driver circuit which suppresses damage of a semiconductor element due to ESD in a manufacturing process, a method of manufacturing the driver circuit. Further provided are a driver circuit provided with a protection circuit with low leakage current, and a method of manufacturing the driver circuit. By providing a protection circuit in a driver circuit to be electrically connected to a semiconductor element in the driver circuit, and by forming, at the same time, a transistor which serves as the semiconductor element in the driver circuit and a transistor included in the protection circuit in the driver circuit, damage of the semiconductor element due to ESD is suppressed in the process of manufacturing the driver circuit. Further, by using an oxide semiconductor film for the transistor included in the protection circuit in the driver circuit, leakage current in the protection circuit is reduced.

7 Claims, 16 Drawing Sheets

(51) Int. Cl.
  *G09G 3/32* (2006.01)
  *G09G 3/36* (2006.01)
  *G11C 19/28* (2006.01)

(52) U.S. Cl.
  CPC ............... *G09G 2310/0267* (2013.01); *G09G 2310/0275* (2013.01); *G09G 2310/0286* (2013.01); *G09G 2330/04* (2013.01)
  USPC .............................................. 361/56; 361/21

(56) References Cited

U.S. PATENT DOCUMENTS

| | | |
|---|---|---|
| 6,294,274 B1 | 9/2001 | Kawazoe et al. |
| 6,320,241 B1 | 11/2001 | Okamoto |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308804 A1* | 12/2008 | Akimoto et al. ............... 257/59 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0038639 A1 | 2/2010 | Akimoto |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0200851 A1* | 8/2010 | Oikawa et al. ............... 257/43 |
| 2011/0163311 A1* | 7/2011 | Akimoto et al. ............... 257/43 |
| 2011/0318875 A1* | 12/2011 | Yamazaki et al. ............ 438/104 |
| 2012/0273779 A1* | 11/2012 | Yamazaki et al. ............. 257/43 |
| 2012/0319106 A1* | 12/2012 | Yamazaki et al. ............. 257/43 |
| 2013/0037799 A1* | 2/2013 | Sakata et al. ................. 257/43 |
| 2013/0062607 A1* | 3/2013 | Yamazaki et al. ............. 257/59 |
| 2013/0140557 A1* | 6/2013 | Miyairi et al. ................. 257/43 |
| 2013/0149813 A1* | 6/2013 | Yamazaki et al. ............ 438/104 |
| 2013/0178015 A1* | 7/2013 | Sasaki et al. ................ 438/104 |
| 2013/0228777 A1* | 9/2013 | Yamazaki et al. ............. 257/43 |
| 2013/0240877 A1* | 9/2013 | Nishijima ..................... 257/43 |
| 2013/0244375 A1* | 9/2013 | Yamazaki et al. ............ 438/104 |
| 2013/0257699 A1* | 10/2013 | Yamazaki et al. ............. 345/84 |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-092448 A | 4/1995 |
| JP | 08-264794 A | 10/1996 |
| JP | 11-505377 | 5/1999 |
| JP | 2000-044236 A | 2/2000 |
| JP | 2000-058762 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Fortunato.E et al., "Wide-Bandgap High-Mobility ZnO Thin-Film Transistors Produced at Room Temperature", Appl. Phys. Lett.

(56) References Cited

OTHER PUBLICATIONS (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m =3, 4, and 5), InGaO3(ZnO)3, and Ga2O3(ZnO)m (m =7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In-13 Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., Optical Studies of the Amorphous Liquid-Cholesteric Liquid Crystal Transition:The "Blue Phase", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Sakata,J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", Journal of the SID, 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer", SID

(56) References Cited

OTHER PUBLICATIONS

Digest '09 : SID International Symposium Digest of Technical Papers, May 31, 2009, pp. 284-287.

Miyasaka.M, "Suftla Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09, SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, andYb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-16202-22.

Park.J et al., "Electronic Transport Properties of Amorphous Indium—Gallium—Zinc Oxide Semiconductor Upon Exposure to Water", Appl. Phys. Lett. (Applied Physics Letter) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using Castep", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

* cited by examiner

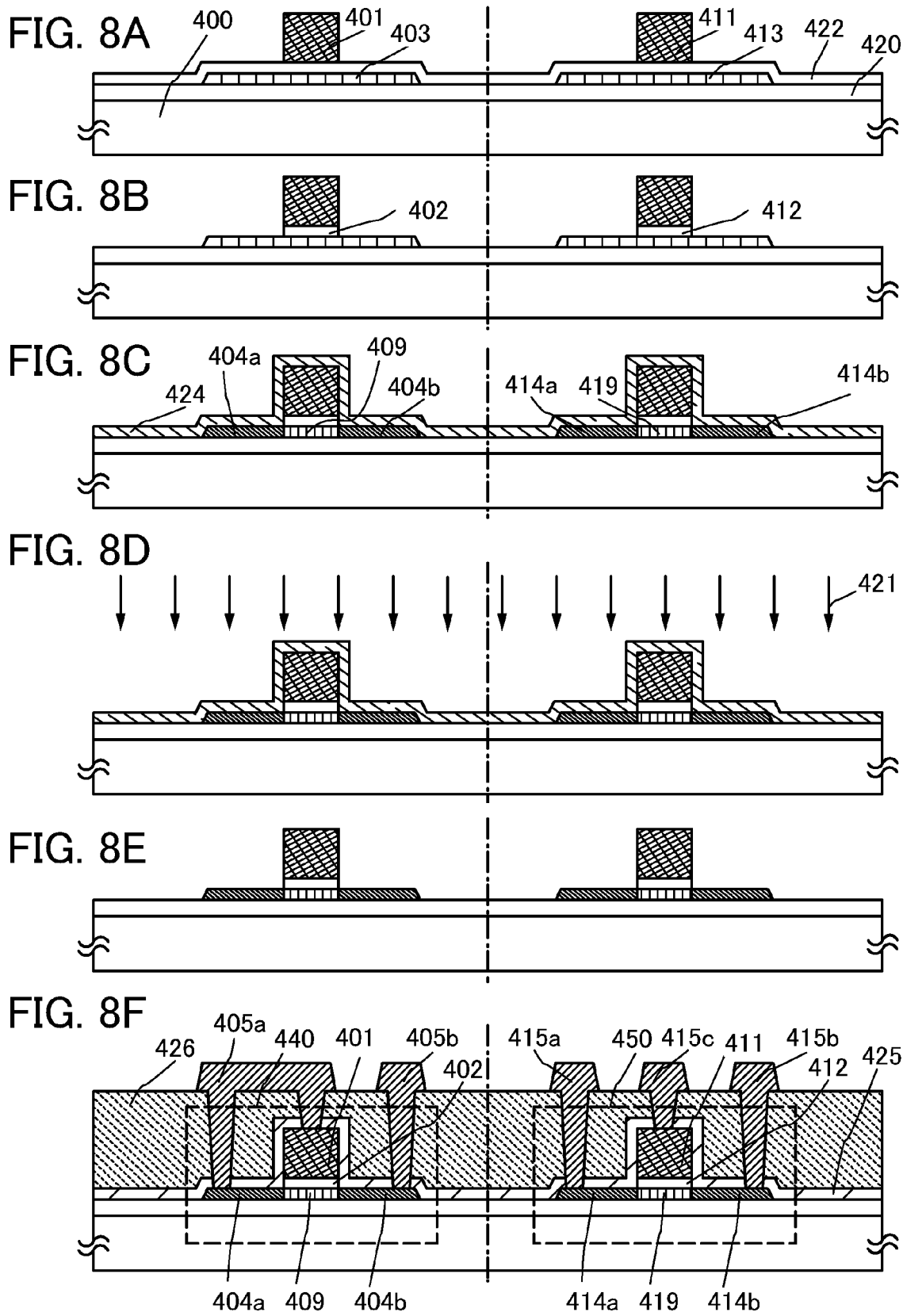

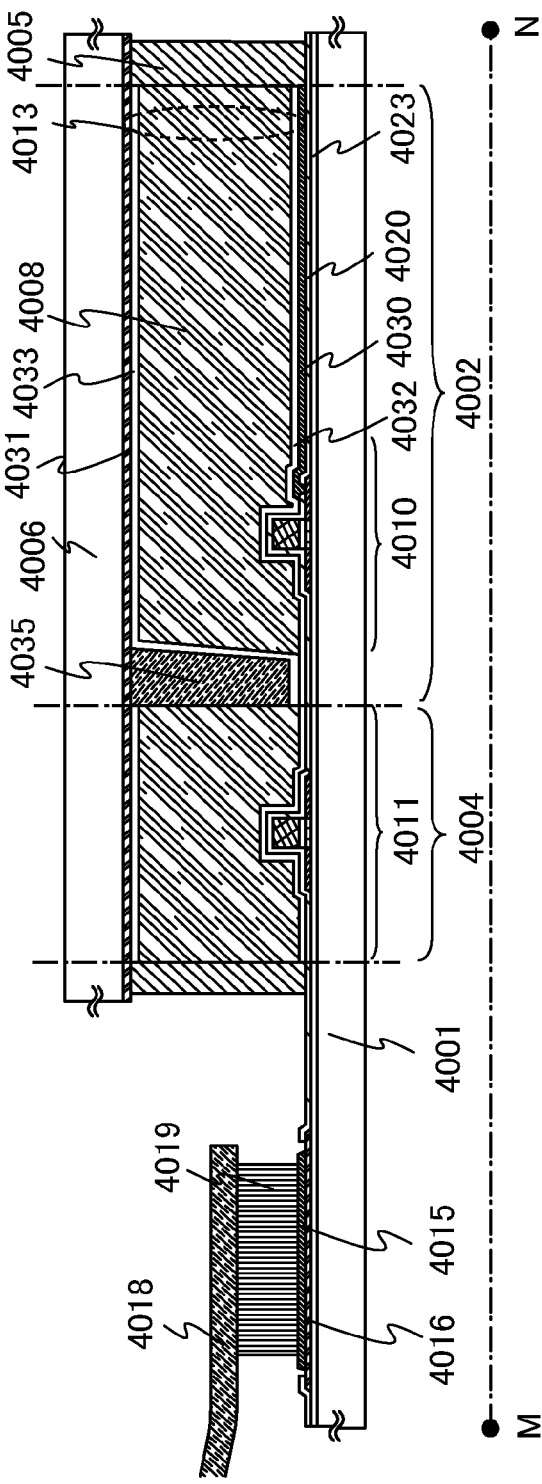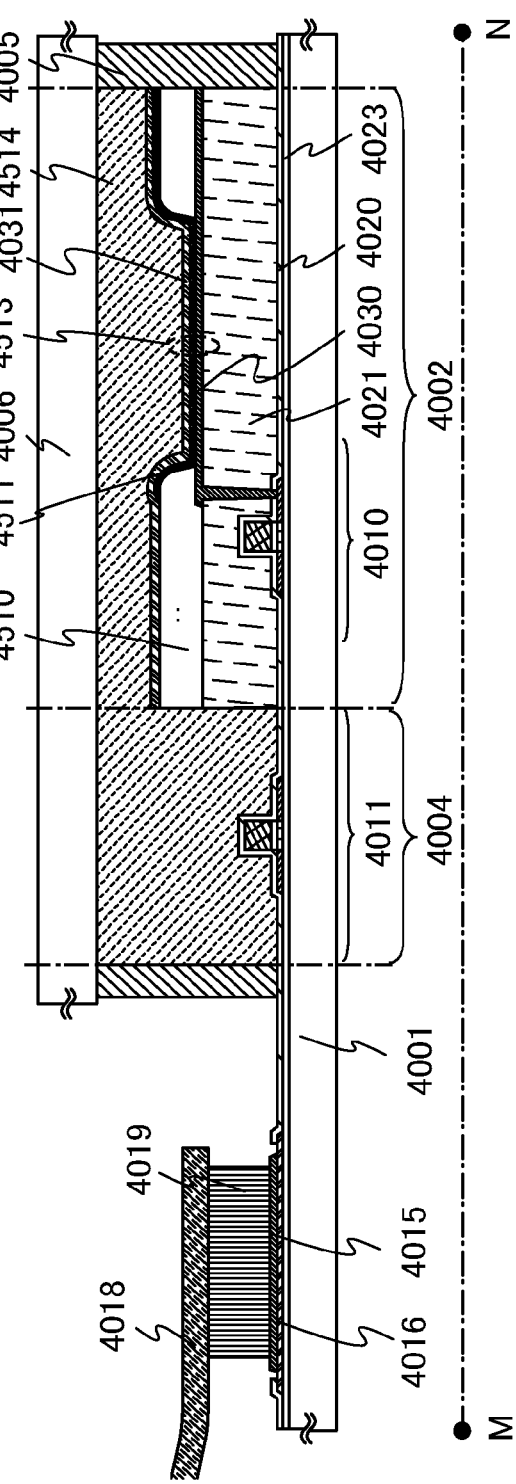
FIG. 13A
FIG. 13B

DRIVER CIRCUIT, METHOD OF MANUFACTURING THE DRIVER CIRCUIT, AND DISPLAY DEVICE INCLUDING THE DRIVER CIRCUIT

BACKGROUND OF THE INVENTION

1. Field of the Invention

The present invention relates to a driver circuit provided with a protection circuit for preventing damage of the circuit in a case where a high voltage such as electrostatic discharge is applied. The invention also relates to a method of manufacturing the driver circuit and a display device including the driver circuit.

2. Description of the Related Art

In a semiconductor circuit used in a semiconductor device such as a display device, a semiconductor element, an electrode, or the like could be damaged by electrostatic discharge (hereinafter referred to as "ESD"). As a measure to prevent damage of a semiconductor circuit due to ESD, a protection circuit is connected to a semiconductor circuit in many cases. A protection circuit refers to a circuit for preventing overvoltage applied to a terminal, a wiring, or the like from being supplied to a semiconductor circuit. A resistor, a diode, a transistor, and a capacitor are typically used in the protection circuit.

Even when noise as well as a signal and power supply voltage is input to a wiring or the like, the protection circuit can also prevent a malfunction of a semiconductor circuit in a later stage due to the noise and degradation or damage of the semiconductor element due to the noise.

Patent Document 1, for example, discloses a technique of connecting a protection circuit in which a MOS transistor whose source and gate are short-circuited and a MOS transistor whose gate and drain are short-circuited are connected in series between a scan electrode of a display device and a conductive line provided in the periphery of a display portion.

REFERENCE

Patent Document

[Patent Document 1] Japanese Published Patent Application No. H7-092448

SUMMARY OF THE INVENTION

However, only the protection circuit formed between the scan electrode of the display device and the conductive line provided in the periphery of the display portion, as described in Patent Document 1, is not sufficient to prevent a semiconductor element such as a transistor provided in a driver circuit of the display device from being damaged by ESD. In particular, when a plasma treatment is performed in a process of manufacturing a transistor in the driver circuit, plasma damage causes ESD in manufacture of the transistor, which may result in damage of the transistor or an electrode.

A semiconductor element (e.g., diode or transistor) using silicon which is a typical semiconductor material has relatively high leakage current in an off state. Therefore, in the case where a protection circuit including such an element is connected between a power supply line and a wiring such as a signal line provided in a driver circuit, leakage current may flow between the wirings to change the potentials of the wirings or the power supply potential, causing unstable operation of the driver circuit.

In view of the above problem, one object of an embodiment of the disclosed invention is to provide a driver circuit which suppresses damage of a semiconductor element due to ESD in a manufacturing process, and a method of manufacturing the driver circuit. Another object of an embodiment of the disclosed invention is to provide a driver circuit provided with a protection circuit with low leakage current, and a method of manufacturing the driver circuit.

According to the disclosed invention, a protection circuit is provided in a driver circuit to be electrically connected to a semiconductor element in the driver circuit. A transistor which serves as the semiconductor element in the driver circuit and a transistor included in the protection circuit in the driver circuit are formed at the same time; as a result, it is possible to suppress damage of the semiconductor element due to ESD in the manufacturing process of the driver circuit. Further, according to the disclosed invention, the transistor included in the protection circuit in the driver circuit includes an oxide semiconductor film, so that leakage current in the protection circuit can be reduced.

An embodiment of the disclosed invention is a driver circuit including a protection circuit and a semiconductor element. The protection circuit includes a transistor including an oxide semiconductor film, one of terminals of the semiconductor element is electrically connected to one of a source electrode layer and a drain electrode layer of the transistor, and a gate electrode layer of the transistor is electrically connected to any one of the source electrode layer and the drain electrode layer of the transistor. The oxide semiconductor film includes a channel formation region which overlaps with the gate electrode layer, and a source region and a drain region which have the channel formation region interposed therebetween, have a lower resistance than the channel formation region, and contain a metal element.

Another embodiment of the disclosed invention is a driver circuit including a high-potential power supply line, a low-potential power supply line, a first protection circuit, a second protection circuit, and a semiconductor element. The first protection circuit includes a first transistor including a first oxide semiconductor film. One of terminals of the semiconductor element is electrically connected to one of a first source electrode layer and a first drain electrode layer of the first transistor, the high-potential power supply line is electrically connected to the other of the first source electrode layer and the first drain electrode layer of the first transistor, and a first gate electrode layer of the first transistor is electrically connected to any one of the first source electrode layer and the first drain electrode layer of the first transistor so that a forward bias is applied when the potential of the one of the terminals of the semiconductor element is higher than the potential of the high-potential power supply line. The second protection circuit includes a second transistor including a second oxide semiconductor film. The one of the terminals of the semiconductor element is electrically connected to one of a second source electrode layer and a second drain electrode layer of the second transistor, the low-potential power supply line is electrically connected to the other of the second source electrode layer and the second drain electrode layer of the second transistor, and a second gate electrode layer of the second transistor is electrically connected to any one of the second source electrode layer and the second drain electrode layer of the second transistor so that a forward bias is applied when the potential of the one of the terminals of the semiconductor element is lower than the potential of the low-potential power supply line.

In the above driver circuit, the first protection circuit may include a plurality of the first transistors electrically connected in series to each other, and the second protection circuit may include a plurality of the second transistors electrically connected in series to each other. The first oxide semiconductor film preferably includes a channel formation region which overlaps with the first gate electrode layer, and a source region and a drain region which have the channel formation region interposed therebetween, have a lower resistance than the channel formation region, and contain a metal element. The second oxide semiconductor film preferably includes a channel formation region which overlaps with the second gate electrode layer, and a source region and a drain region which have the channel formation region interposed therebetween, have a lower resistance than the channel formation region, and contain a metal element.

The semiconductor element is preferably a third transistor including a third oxide semiconductor film. The third oxide semiconductor film preferably includes a channel formation region which overlaps with a gate electrode layer of the third transistor, and a source region and a drain region which have the channel formation region interposed therebetween, have a lower resistance than the channel formation region, and contain a metal element.

Another embodiment of the disclosed invention is a display device including the above driver circuit.

Another embodiment of the disclosed invention is a method of manufacturing a driver circuit, including the steps of forming an oxide semiconductor film over a substrate; forming a gate insulating film and a gate electrode layer in a stacked manner over the oxide semiconductor film; forming a film containing a metal element over the oxide semiconductor film, the gate insulating film, and the gate electrode layer so as to be in contact with part of the oxide semiconductor film by a sputtering method while the substrate is heated; forming a channel formation region in a region of the oxide semiconductor film, which overlaps with the gate electrode layer; forming, in regions of the oxide semiconductor film, which have the channel formation region interposed therebetween, a source region and a drain region which have a lower resistance than the channel formation region and contain the metal element; removing the film containing the metal element by wet etching; forming an insulating film over the oxide semiconductor film, the gate insulating film, and the gate electrode layer; forming a source electrode layer and a drain electrode layer over the insulating film so as to be electrically connected to the source region and the drain region, respectively, through an opening formed in the insulating film, wherein one of the source electrode layer and the drain electrode layer is electrically connected to one of terminals of a semiconductor element formed over a same substrate, and wherein the other of the source electrode layer and the drain electrode layer is electrically connected to a wiring formed over the same substrate; and forming a transistor to be used as a protection circuit wherein the gate electrode layer is electrically connected to any one of the source electrode layer and the drain electrode layer. In the above method, the film containing the metal element is preferably formed in an argon atmosphere, a nitrogen atmosphere, or a vacuum.

Another embodiment of the disclosed invention is a method of manufacturing a driver circuit, including the steps of forming an oxide semiconductor film over a substrate; forming a gate insulating film and a gate electrode layer in a stacked manner over the oxide semiconductor film; forming a film containing a metal element over the oxide semiconductor film, the gate insulating film, and the gate electrode layer so as to be in contact with part of the oxide semiconductor film by a sputtering method; heating the oxide semiconductor film and the film containing the metal element so that the metal element is introduced from the film containing the metal element into the oxide semiconductor film, whereby forming a channel formation region in a region of the oxide semiconductor film, which overlaps with the gate electrode layer, and forming, in regions of the oxide semiconductor film, which have the channel formation region interposed therebetween, a source region and a drain region which have a lower resistance than the channel formation region and contain the metal element; removing the film containing the metal element by wet etching; forming an insulating film over the oxide semiconductor film, the gate insulating film, and the gate electrode layer; forming a source electrode layer and a drain electrode layer over the insulating film so as to be electrically connected to the source region and the drain region, respectively, through an opening formed in the insulating film, wherein one of the source electrode layer and the drain electrode layer is electrically connected to one of terminals of a semiconductor element formed over a same substrate, and wherein the other of the source electrode layer and the drain electrode layer is electrically connected to a wiring formed over the same substrate; and forming a transistor to be used as a protection circuit wherein the gate electrode layer is electrically connected to any one of the source electrode layer and the drain electrode layer. In the above method, the oxide semiconductor film and the film containing the metal element are preferably heated in an argon atmosphere, a nitrogen atmosphere, or a vacuum.

In any one of the above methods, after the film containing the metal element is formed and before the film containing the metal element is removed, it is preferable that a dopant be selectively introduced into the oxide semiconductor film by using the gate insulating film and the gate electrode layer as masks through the film containing the metal element, so that a source region and a drain region which have a lower resistance than the channel formation region and contain the metal element can be formed in regions of the oxide semiconductor film, which have the channel formation region interposed therebetween.

The semiconductor element is preferably a second transistor including an oxide semiconductor, and the second transistor is preferably formed at a same time as the transistor.

It is preferable that an etching selectivity ratio of the film containing the metal element to the gate electrode layer in the wet etching of the film containing the metal element is greater than 1. Further, any of aluminum and magnesium is preferably used as the metal element. Furthermore, any of phosphorus and boron is used as the dopant.

In this specification and the like, a "driver circuit" means a scan line driver circuit and/or a signal line driver circuit in a display device. Further, a "semiconductor element forming a driver circuit" or a "semiconductor element included in a driver circuit" means a semiconductor element which is connected inside a wiring for inputting a signal to the driver circuit and is connected inside a wiring for outputting a signal from the driver circuit.

In this specification and the like, the term such as "electrode" or "wiring" does not limit a function of a component. For example, an "electrode" is sometimes used as part of a "wiring", and vice versa. In addition, the term "electrode" or "wiring" can also mean a combination of a plurality of "electrodes" and "wirings", for example.

Functions of a "source" and a "drain" are sometimes replaced with each other when a transistor of opposite conductivity type is used or when the direction of current flowing is changed in circuit operation, for example. Therefore, the terms "source" and "drain" can be replaced with each other in this specification.

Note that in this specification and the like, the term "electrically connected" includes the case where components are connected through an object having any electric function. There is no particular limitation on an object having any electric function as long as electric signals can be transmitted and received between components that are connected through the object.

Examples of an object having any electric function are a switching element such as a transistor, a resistor, an inductor, a capacitor, and an element with a variety of functions as well as an electrode and a wiring.

According to an embodiment of the disclosed invention, it is possible to provide a driver circuit which suppresses damage of a semiconductor element due to ESD in a manufacturing process, and a method of manufacturing the driver circuit. According to an embodiment of the disclosed invention, it is also possible to provide a driver circuit provided with a protection circuit with low leakage current, and a method of manufacturing the driver circuit.

BRIEF DESCRIPTION OF THE DRAWINGS

In the accompanying drawings:

FIGS. 8A to 8F are cross-sectional views illustrating a method of manufacturing a protection circuit used in a driver circuit;

FIGS. 13A and 13B each illustrate a display device including a driver circuit;

DETAILED DESCRIPTION OF THE INVENTION

Figure 1:
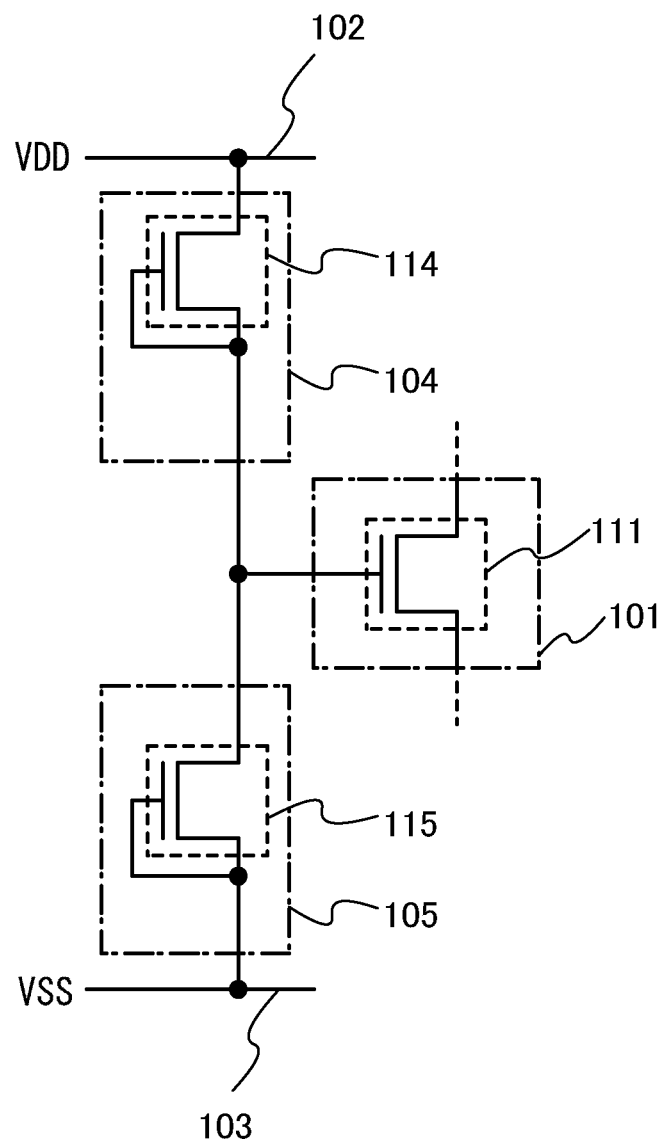
FIG. 1 is a circuit diagram illustrating protection circuits used in a driver circuit.

Hereinafter, embodiments of the invention will be described with reference to the drawings. Note that the invention is not limited to the following description and it will be readily appreciated by those skilled in the art that modes and details can be modified in various ways without departing from the spirit and the scope of the invention. Therefore, the invention should not be construed as being limited to the description in the following embodiments. In the following embodiments, the same portions or portions having similar functions are denoted by the same reference numerals in different drawings, and explanation thereof will not be repeated.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not mean limitation of the number of components.

(Embodiment 1)

In this embodiment, configurations and operation methods of a driver circuit and a protection circuit which can be used in the driver circuit, according to an embodiment of the disclosed invention, will be described with reference to FIG. 1, FIG. 2, FIGS. 3A and 3B, and FIGS. 4A and 4B.

FIG. 1 illustrates a connection relation between protection circuits used in a driver circuit and a semiconductor element included in the driver circuit, according to an embodiment of the disclosed invention. In the driver circuit, a first protection circuit 104 is provided between one of terminals of a semiconductor element 101 included in the driver circuit and a first wiring 102, and a second protection circuit 105 is provided between the one of the terminals of the semiconductor element 101 included in the driver circuit and a second wiring 103. In the driver circuit in FIG. 1, the first wiring 102 can be a high-potential power supply line (VDD) and the second wiring 103 can be a low-potential power supply line (VSS). Further, the second wiring 103 may be a ground potential line (GND).

In the driver circuit in FIG. 1, a transistor 114 is provided as the first protection circuit 104, a transistor 115 is provided as the second protection circuit 105, and a transistor 111 is provided as the semiconductor element 101. Here, a gate electrode layer of the transistor 111 is electrically connected to one of a source electrode layer and a drain electrode layer of the transistor 114 and one of a source electrode layer and a drain electrode layer of the transistor 115. Further, the other of the source electrode layer and the drain electrode layer of the transistor 114 is electrically connected to the first wiring 102, and the other of the source electrode layer and the drain electrode layer of the transistor 115 is electrically connected to the second wiring 103. Furthermore, a gate electrode layer of the transistor 114 is electrically connected to any one of the source electrode layer and the drain electrode layer of the transistor 114 so that a forward bias is applied when the potential of the gate electrode layer of the transistor 111 is higher than the potential of the first wiring 102. In addition, a gate electrode layer of the transistor 115 is electrically connected to any one of the source electrode layer and the drain electrode layer of the transistor 115 so that a forward bias is applied when the potential of the gate electrode layer of the transistor 111 is lower than that of the second wiring 103.

In this embodiment, the transistors 114 and 115 are described as n-channel transistors, but may be, without limitation, p-channel transistors. In the case where p-channel transistors are used, potentials given to the first wiring 102 and the second wiring 103 are replaced with each other.

The semiconductor element 101 is not limited to a transistor, but may be any semiconductor element forming the driver circuit. A terminal of the semiconductor element 101 includes a wiring connected to the semiconductor element. Further, it is possible to provide a plurality of semiconductor elements 101 in a driver circuit and to provide the first protection circuit 104 and the second protection circuit 105 for each of the plurality of semiconductor elements 101 in a manner similar to that in FIG. 1.

The first protection circuit 104 is a non-linear element which applies a forward bias or a reverse bias depending on the value of voltage applied between the first wiring 102 and the terminal of the semiconductor element 101. In the driver circuit in FIG. 1, the first protection circuit 104 is the transistor 114 the gate electrode layer of which is electrically connected to any one of the source electrode layer and the drain electrode layer. Here, in the case where the transistor 114 is an n-channel transistor, the gate electrode layer thereof is electrically connected to one of the source electrode layer and the drain electrode layer (the source electrode layer in this case).

Figure 2:
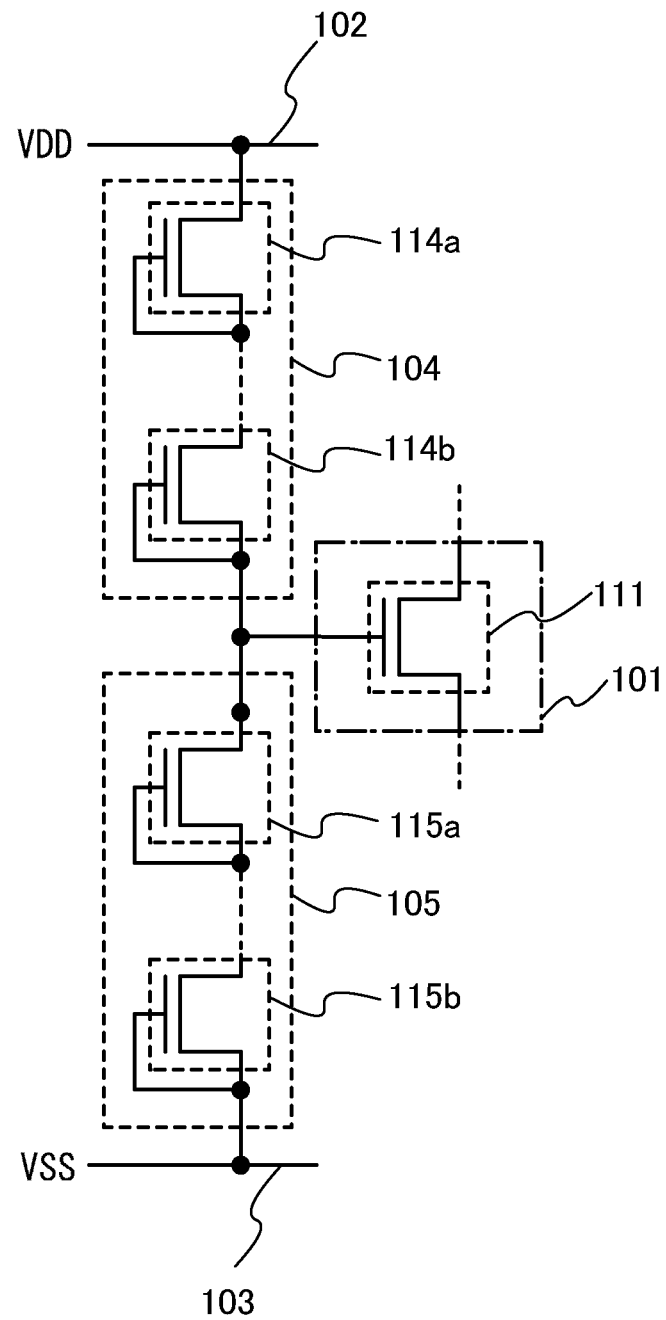
FIG. 2 is a circuit diagram illustrating protection circuits used in a driver circuit.

The first protection circuit 104 includes at least one transistor 114 the gate electrode layer of which is electrically connected to any one of the source electrode layer and the drain electrode layer, and may include another semiconductor element. For example, as illustrated in FIG. 2, the first protection circuit 104 may include a transistor 114a and a transistor 114b which are electrically connected in series to each other and in each of which a gate electrode layer is electrically connected to any one of a source electrode layer and a drain electrode layer. Needless to say, three or more transistors may be electrically connected in series to one another.

The second protection circuit 105 is a non-linear element which applies a forward bias or a reverse bias depending on the value of voltage applied between the second wiring 103 and the terminal of the semiconductor element 101. In the driver circuit in FIG. 1, the second protection circuit 105 is the transistor 115 the gate electrode layer of which is electrically connected to any one of the source electrode layer and the drain electrode layer. Here, in the case where the transistor 115 is an n-channel transistor, the gate electrode layer thereof is electrically connected to the other of the source electrode layer and the drain electrode layer (the source electrode layer in this case).

In a manner similar to that in the first protection circuit 104, the second protection circuit 105 includes at least one transistor 115 the gate electrode layer of which is electrically connected to any one of the source electrode layer and the drain electrode layer, and may include another semiconductor element. For example, as illustrated in FIG. 2, the second protection circuit 105 may include a transistor 115a and a transistor 115b which are electrically connected in series to each other and in each of which a gate electrode layer is electrically connected to any one of a source electrode layer and a drain electrode layer. Needless to say, three or more transistors may be electrically connected in series to one another.

The off-state current of each of the transistors 114 and 115 is preferably extremely low when a reverse bias is applied. An example of a transistor with extremely low off-state current is a transistor in which a semiconductor having a wider band gap than silicon (wide band gap semiconductor) is used for a channel formation region.

To obtain extremely high off-state resistance, specifically, the band gap of silicon (band gap: 1.1 eV) is not enough. It is favorable to use a wide band gap semiconductor having a band gap of greater than or equal to 2.5 eV and less than or equal to 4 eV, preferably greater than or equal to 3 eV and less than or equal to 3.8 eV. For example, as the wide band gap semiconductor, a compound semiconductor such as silicon carbide (SiC) or gallium nitride (GaN), an oxide semiconductor formed of metal oxide such as an In—Ga—Zn—O-based oxide semiconductor, or the like can be used.

The off-state resistance of a semiconductor layer, in which a channel is formed, of a transistor is inversely proportional to the concentration of carriers excited thermally. Since the band gap of silicon is 1.1 eV even when carriers caused by a donor or an acceptor do not exist at all (intrinsic semiconductor), the concentration of carriers excited by heat at room temperature (300 K) is approximately $1\times10^{11}$ cm$^{-3}$.

On the other hand, the concentration of thermally excited carriers of a wide band gap semiconductor having a band gap of 3.2 eV is approximately $1\times10^{-7}$ cm$^{-3}$. When the electron mobility is the same, the off-state resistance is inversely proportional to the carrier concentration, so that the off-state resistance of the semiconductor the band gap of which is 3.2 eV is 18 orders of magnitude higher than that of silicon. As such a compound semiconductor, an In—Ga—Zn—O-based oxide semiconductor and an In—Sn—Zn—O-based oxide semiconductor are known for example.

Therefore, when the wide band gap semiconductor typified by an oxide semiconductor is used for the transistors 114 and 115, the off-state current in application of a reverse bias can be extremely low. Similarly, the transistor 111 included in the driver circuit preferably includes the wide band gap semiconductor typified by the oxide semiconductor. Thus, the off-state current of the transistor 111 can be reduced, and the power consumption of the driver circuit can be reduced.

As described above, in the driver circuit, the first protection circuit 104 and the second protection circuit 105 are connected to the one of the terminals of the semiconductor element 101 included in the driver circuit. Accordingly, even when a high surge voltage such as ESD is applied to the one of the terminals of the semiconductor element 101, the first protection circuit 104 or the second protection circuit 105 serves as a discharge path, thereby preventing surge current from flowing into the semiconductor element 101.

For example, when a positive surge voltage is applied to the one of the terminals of the semiconductor element 101, a forward bias is applied to the first protection circuit 104, so that current flows from the one of the terminals of the semiconductor element 101 to the first wiring 102. Further, when a negative surge voltage is applied to the one of the terminals of the semiconductor element 101, a forward bias is applied to the second protection circuit 105, so that current flows from the second wiring 103 to the one of the terminals of the semiconductor element 101. In this manner, electric charge supplied to the one of the terminals of the semiconductor element 101 by ESD or the like can be canceled and unwanted inflow of electric charge into the semiconductor element 101 can be prevented. In particular, in the case where the transistor 111 is used as the semiconductor element 101 without providing the first protection circuit 104 and the second protection circuit 105, excessive current passes through the gate insulating film of the transistor 111 due to a surge voltage, which may result in dielectric breakdown of the transistor 111. However, the first protection circuit 104 and the second protection circuit 105 can eliminate such a possibility.

The first protection circuit 104 and the second protection circuit 105 have the above function not only in the case where a high potential is given to the first wiring 102 and a low potential is given to the second wiring 103, but also in the case where these potentials are not given to the first wiring 102 nor the second wiring 103, that is, during a process of manufacturing the driver circuit or during when the driver circuit is being attached to a display device. Since the absolute value of the positive surge voltage is sufficiently large, a forward bias is applied to the first protection circuit 104 even when a high potential is not given to the first wiring 102. Further, since the absolute value of the negative surge voltage is also sufficiently large, a forward bias is applied to the second protection circuit 105 even when a low potential is not given to the second wiring 103.

Note that, to operate the first protection circuit 104 and the second protection circuit 105 during the process of manufacturing the driver circuit, the first protection circuit 104, the second protection circuit 105, and the semiconductor element 101 need to be fabricated at the same time. Therefore, the transistors 114, 115, and 111 preferably have the same structure and are preferably fabricated at the same time.

In a usual operation of the driver circuit, a reverse bias is applied to the transistor 114 used in the first protection circuit 104 or to the transistor 115 used in the second protection circuit 105. Alternatively, a potential difference between the first wiring 102 and the one of the terminals of the semiconductor element 101 or between the second wiring 103 and the one of the terminals of the semiconductor element 101 does not exceed an operation voltage of the transistor 114 or the transistor 115. Therefore, the first protection circuit 104 or the second operation circuit 105 does not operate basically.

Note that the use of a semiconductor having a narrow band gap, such as silicon, for the transistors 114 and 115, causes a minute amount of current to flow even with a reverse bias. Therefore, leakage current flows between the first wiring 102 and the one of the terminals of the semiconductor element 101 or between the second wiring 103 and the one of the terminals of the semiconductor element 101, resulting in a change in the potential of the first wiring 102, the second wiring 103, or the one of the terminals of the semiconductor element 101.

However, as described above, by using the wide band gap semiconductor typified by the oxide semiconductor for the transistors 114 and 115, the off-state current of the transistors 114 and 115 in application of a reverse bias can be extremely low. Therefore, leakage current in the first protection circuit 104 and the second protection circuit 105 can be reduced.

Further, when the transistors 114 or the transistors 115 are connected in series to obtain the first protection circuit 104 or the second protection circuit 105 as illustrated in FIG. 2, it is possible to increase a potential difference corresponding to a forward bias applied to the first protection circuit 104 to flow current between the one of the terminals of the semiconductor element 101 and the first wiring 102 or a potential difference corresponding to a forward bias applied to the second protection circuit 105 to flow current between the one of the terminals of the semiconductor element 101 and the second wiring 103. For example, when n transistors 114 are connected in series, forward bias current does not flow unless the potential difference between the one of the terminals of the semiconductor element 101 and the first wiring 102 is greater than or equal to n×$V_{th}$ ($V_{th}$ is the threshold voltage of the transistor 114). Thus, it is possible to prevent the first protection circuit 104 or the second protection circuit 105 from operating owing to a slight noise input to the terminal of the semiconductor element 101.

The following shows examples of a driver circuit in which the protection circuits in FIG. 1 or FIG. 2 can be used, and an active matrix display device in which the driver circuit is used.

Figure 3A:
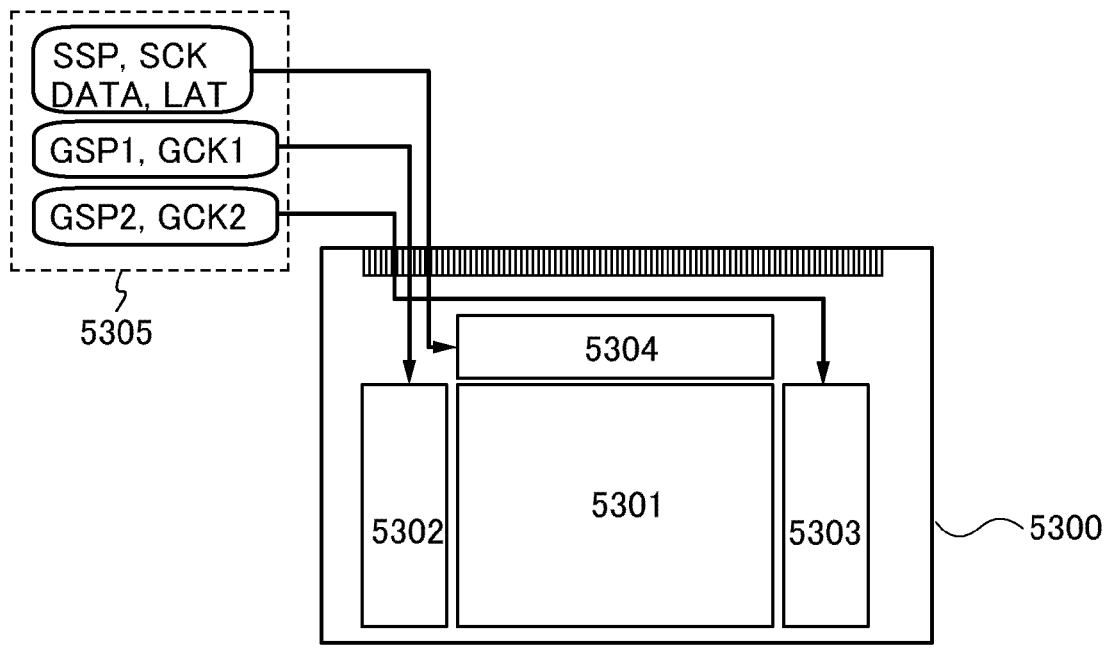
FIGS. 3A and 3B are block diagrams each illustrating a display device.

FIG. 3A illustrates an example of a block diagram of an active matrix display device. A pixel portion 5301, a first scan line driver circuit 5302, a second scan line driver circuit 5303, and a signal line driver circuit 5304 are provided over a substrate 5300 in the display device. In the pixel portion 5301, a plurality of signal lines which are extended from the signal line driver circuit 5304 are provided and a plurality of scan lines which are extended from the first scan line driver circuit 5302 and the second scan line driver circuit 5303 are provided. Note that pixels which include display elements are provided in a matrix in respective regions where the scan lines and the signal lines intersect with each other. Further, the substrate 5300 in the display device is connected to a timing control circuit 5305 (also referred to as controller or controller IC) through a connection portion such as a flexible printed circuit (FPC).

The driver circuit in FIG. 1 or FIG. 2 can be used for the first scan line driver circuit 5302, the second scan line driver circuit 5303, or the signal line driver circuit 5304 in FIG. 3A. Note that the first scan line driver circuit 5302, the second scan line driver circuit 5303, and the signal line driver circuit 5304 are formed over the same substrate 5300 as the pixel portion 5301. Accordingly, the number of components of a driver circuit which is provided externally and the like is reduced, so that reduction in cost can be achieved. Moreover, the number of connection portions (e.g., FPC) between the substrate 5300 and external driver circuits can be reduced, and the reliability or yield can be increased.

Note that as an example, the timing control circuit 5305 supplies a first scan line driver circuit start signal (GSP1) and a scan line driver circuit clock signal (GCK1) to the first scan line driver circuit 5302. The timing control circuit 5305 supplies, for example, a second scan line driver circuit start signal (GSP2) (also referred to as start pulse) and a scan line driver circuit clock signal (GCK2) to the second scan line driver circuit 5303. The timing control circuit 5305 supplies a signal line driver circuit start signal (SSP), a signal line driver circuit clock signal (SCK), video signal data (DATA) (also simply referred to as video signal) and a latch signal (LAT) to the signal line driver circuit 5304. Note that each clock signal may be a plurality of clock signals periods of which are different or may be supplied together with an inverted clock signal (CKB). Note that one of the first scan line driver circuit 5302 and the second scan line driver circuit 5303 can be omitted.

Figure 3B:
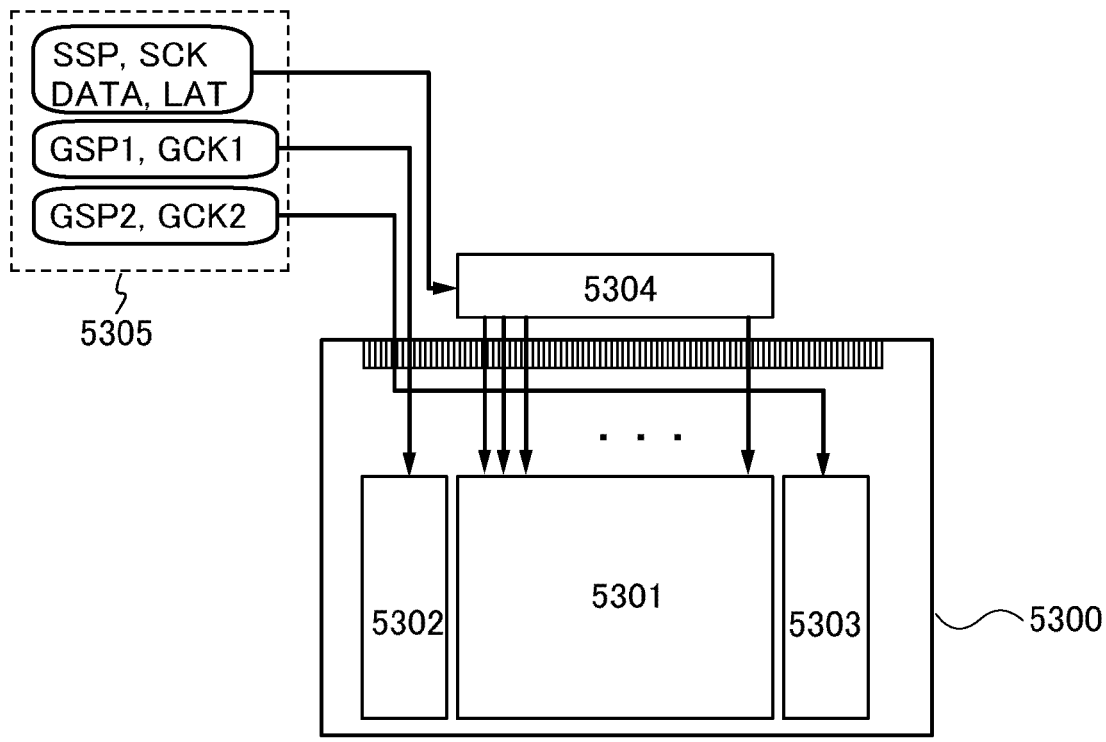

FIG. 3B illustrates a structure in which circuits with low driving frequency (e.g., the first scan line driver circuit 5302 and the second scan line driver circuit 5303) are formed over the same substrate 5300 as the pixel portion 5301, and the signal line driver circuit 5304 is formed over a substrate which is different from the substrate for the pixel portion 5301. With this structure, a driver circuit formed over the substrate 5300 can be constituted by using thin film transistors with lower field-effect mobility than a transistor formed using a single crystal semiconductor. Accordingly, increase in the size of the display device, reduction in the number of steps, reduction in cost, improvement in yield, or the like can be achieved.

An LSI may be used for the first scan line driver circuit 5302, the second scan line driver circuit 5303, or the signal line driver circuit 5304, and part of the driver circuits in FIGS. 3A and 3B.

In the following, an example of a structure and operation of a signal line driver circuit formed using an n-channel TFT will be described with reference to FIGS. 4A and 4B.

The signal line driver circuit includes a shift register 5601 and a switching circuit 5602. The switching circuit 5602 includes a plurality of switching circuits 5602_1 to 5602_N (N is a natural number). The switching circuits 5602_1 to 5602_N each include a plurality of thin film transistors 5603_1 to 5603_*k* (k is a natural number). A case in which the thin film transistors 5603_1 to 5603_*k* are n-channel TFTs is exemplified.

A connection relation in the signal line driver circuit is described by using the switching circuit 5602_1 as an example. First terminals of the thin film transistors 5603_1 to 5603_*k* are connected to wirings 5604_1 to 5604_*k*, respectively. Second terminals of the thin film transistors 5603_1 to 5603_*k* are connected to signal lines S1 to Sk, respectively. Gates of the thin film transistors 5603_1 to 5603_*k* are connected to a wiring 5605_1.

The shift register 5601 has a function of outputting an H level signal (also referred to as H signal or high power supply potential level) to the wirings 5605_1 to 5605_N in that order and selecting the switching circuits 5602_1 to 5602_N in that order.

For example, the switching circuit 5602_1 has a function of controlling conduction states between the wirings 5604_1 to 5604_*k* and the signal lines S1 to Sk (conduction states between the first terminals and the second terminals), that is, a function of controlling whether or not to supply potentials of the wirings 5604_1 to 5604_*k* to the signal lines S1 to Sk. As thus described, the switching circuit 5602_1 functions as a selector. Further, the thin film transistors 5603_1 to 5603_*k* each have a function of controlling electrical continuity between the wirings 5604_1 to 5604_*k* and the signal lines S1 to Sk, namely a function of controlling whether or not to supply the potentials of the wirings 5604_1 to 5604_*k* to the signal lines S1 to Sk. In this manner, each of the thin film transistors 5603_1 to 5603_*k* functions as a switch.

Note that video signal data (DATA) is input to each of the wirings 5604_1 to 5604_*k*. The video signal data (DATA) is an analog signal corresponding to image data or image signals in many cases.

Figure 4A:
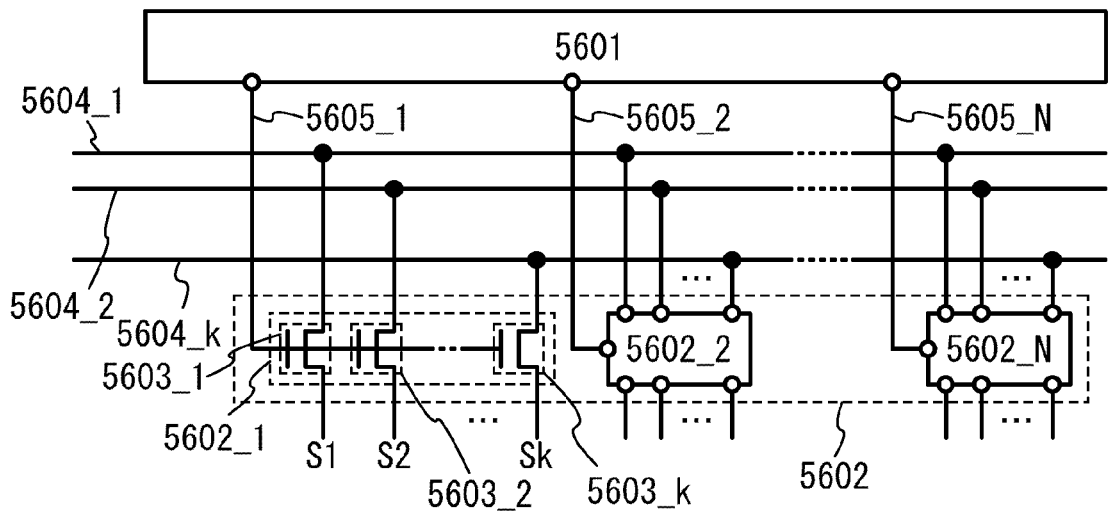
FIG. 4A illustrates a configuration of a signal line driver circuit and FIG. 4B is a timing chart illustrating operation of the signal line driver circuit.
Figure 4B:
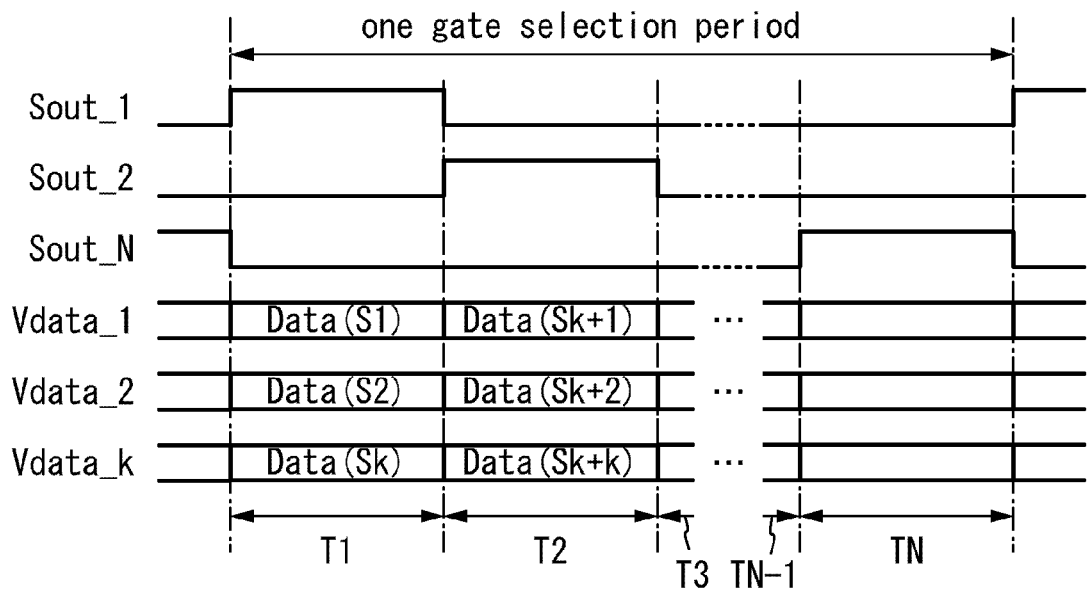

The following shows operation of the signal line driver circuit illustrated in FIG. 4A with reference to a timing chart in FIG. 4B. Examples of signals Sout_1 to Sout_N and signals Vdata_1 to Vdata_k are shown in FIG. 4B. The signals Sout_1 to Sout_N are examples of signals output from the shift register 5601, and the signals Vdata_1 to Vdata_k are examples of signals input to the wirings 5604_1 to 5604_*k*. Note that one operation period of the signal line driver circuit corresponds to one gate selection period in a display device. For example, one gate selection period is divided into periods T1 to TN. The periods T1 to TN are periods for writing video signal data (DATA) to the pixels which belong to a selected row.

Note that signal waveform distortion and the like in each structure illustrated in drawings and the like in this embodiment are exaggerated for simplicity in some cases. Therefore, this embodiment is not necessarily limited to the scale illustrated in the drawings and the like.

In the periods T1 to TN, the shift register 5601 sequentially outputs H level signals to the wirings 5605_1 to 5605_N. For example, in the period T1, the shift register 5601 outputs an H level signal to the wiring 5605_1. Then, the thin film transistors 5603_1 to 5603_*k* are turned on, so that the wirings 5604_1 to 5604_*k* and the signal lines S1 to Sk have electrical continuity. In this case, Data (S1) to Data (Sk) are input to the wirings 5604_1 to 5604_*k*, respectively. The Data (S1) to Data (Sk) are input to pixels in a selected row in a first to k-th columns through the thin film transistors 5603_1 to 5603_*k*, respectively. Thus, in the periods T1 to TN, video signal data (DATA) is sequentially written to the pixels in the selected row of every k columns.

By writing video signal data (DATA) to pixels of every plurality of columns, the number of video signal data (DATA) or the number of wirings can be reduced. Thus, connections to an external circuit can be reduced. Further, by writing the data for a video signal (DATA) to pixels of a plurality of columns each time, write time can be extended, and shortage of writing of the data for a video signal (DATA) can be prevented.

Examples of a shift register which can be used for part of the scan line driver circuit and/or the signal line driver circuit and in which the protection circuits in FIG. 1 or FIG. 2 are used will be described with reference to FIGS. 5A and 5B, FIG. 6, and FIG. 7.

The scan line driver circuit includes a shift register. Additionally, the scan line driver circuit may include a level shifter, a buffer, or the like in some cases. In the scan line driver circuit, when the clock signal (CK) and the start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Since the transistors in the pixels of one line have to be turned on all at once, a buffer which can supply large current is used.

Figure 5A:
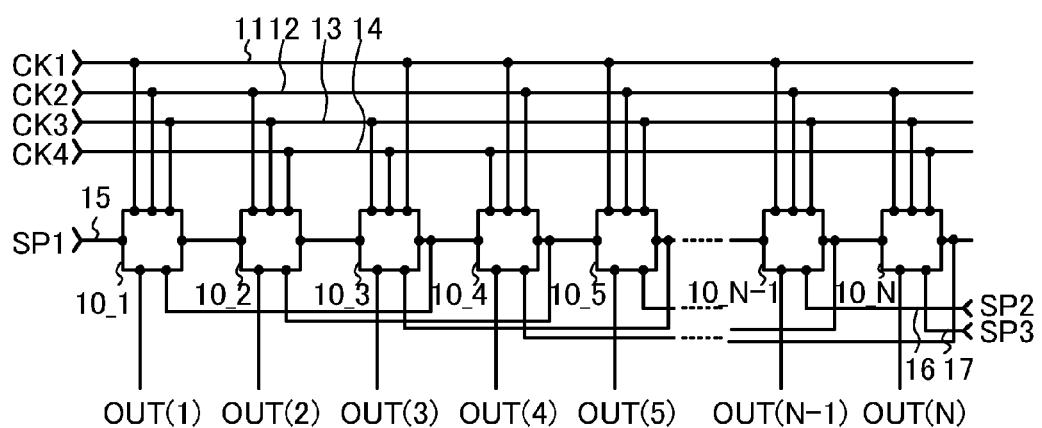
FIGS. 5A and 5B are block diagrams illustrating a shift register and pulse output circuits included in a driver circuit.

The shift register includes first to N-th pulse output circuits 10_1 to 10_N (N is a natural number of greater than or equal to 3) (see FIG. 5A). A first clock signal CK1 from a first wiring 11, a second clock signal CK2 from a second wiring 12, a third clock signal CK3 from a third wiring 13, and a fourth clock signal CK4 from a fourth wiring 14 are supplied in the first to N-th pulse output circuits 10_1 to 10_N of the shift register illustrated in FIG. 5A. A start pulse SP1 (first start pulse) from a fifth wiring 15 is input to the first pulse output circuit 10_1. To the n-th pulse output circuit 10_*n* (n is a natural number greater than or equal to 2 and less than or equal to N) in the second stage or subsequent stages, a signal from the pulse output circuit in the preceding stage (such a signal is referred to as preceding-stage signal OUT(n−1) (n is a natural number greater than or equal to 2)) is input. A signal from the third pulse output circuit 10_3 which is two stages after the first pulse output circuit 10_1 is input to the first pulse output circuit 10_1. In a similar manner, a signal from the (n+2)-th pulse output circuit 10_(*n*+2) which is two stages after the n-th pulse output circuit 10_*n* (referred to as the next stage signal OUT(n+2)) is input to the n-th pulse output circuit 10_*n* in the second stage or its subsequent stages. Therefore, the pulse output circuits of the respective stages output first output signals (OUT(1)(SR) to OUT(N)(SR)) to be input to the pulse output circuit of the respective subsequent stage and/or the pulse output circuit of the stage before the previous stage and second output signals (OUT(1) to OUT(N)) to be input to another wiring or the like. Note that since the subsequent-stage signal OUT(n+2) is not input to the last two stages of the shift register as illustrated in FIG. 5A, a second start pulse SP2 from the sixth wiring 16 and a third start pulse SP3 from the seventh wiring 17 may be input to the stage before the last stage and the last stage, respectively, for example. Alternatively, a signal which is additionally generated in the shift register may be used. For example, a (N+1)-th pulse output circuit 10_(N+1) and a (N+2)-th pulse output circuit 10_(N+2) which do not contribute to output of pulses to a display portion (such circuits are also referred to as dummy stages) may be provided, and signals corresponding to a second start pulse (SP2) and a third start pulse (SP3) may be generated from the dummy stages.

Note that a clock signal (CK) is a signal which oscillates between an H level and an L level (referred to as L signal or low power supply potential level) at a constant cycle. The first to the fourth clock signals (CK1) to (CK4) are delayed by ¼ period sequentially. In this embodiment, by using the first to fourth clock signals (CK1) to (CK4), control or the like of driving of a pulse output circuit is performed. Although the clock signal is also represented by GCK or SCK depending on the driver circuit to which the signal is input, CK is used here.

A first input terminal 21, a second input terminal 22, and a third input terminal 23 are electrically connected to any of the first to fourth wirings 11 to 14. For example, in FIG. 5A, the first input terminal 21 of the first pulse output circuit 10_1 is electrically connected to the first wiring 11, the second input terminal 22 of the first pulse output circuit 10_1 is electrically connected to the second wiring 12, and the third input terminal 23 of the first pulse output circuit 10_1 is electrically connected to the third wiring 13. In addition, the first input terminal 21 of the second pulse output circuit 10_2 is electrically connected to the second wiring 12, the second input terminal 22 of the second pulse output circuit 10_2 is electrically connected to the third wiring 13, and the third input terminal 23 of the second pulse output circuit 10_2 is electrically connected to the fourth wiring 14.

Figure 5B:
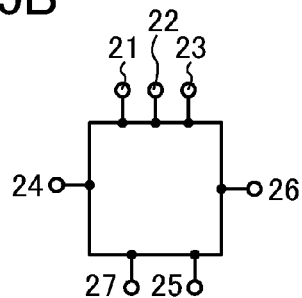

Each of the first to N-th pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 5B). In the first pulse output circuit 10_1, the first clock signal CK1 is input to the first input terminal 21; the second clock signal CK2 is input to the second input terminal 22; the third clock signal CK3 is input to the third input terminal 23; the start pulse is input to the fourth input terminal 24; the subsequent-stage signal OUT(3) is input to the fifth input terminal 25; the first output signal OUT(1)(SR) is output from the first output terminal 26; and the second output signal OUT(1) is output from the second output terminal 27.

In the following, a specific example of a circuit configuration in which the protection circuits in FIG. 1 or FIG. 2 are used for the pulse output circuit in FIG. 5A will be described with reference to FIG. 6.

Figure 6:
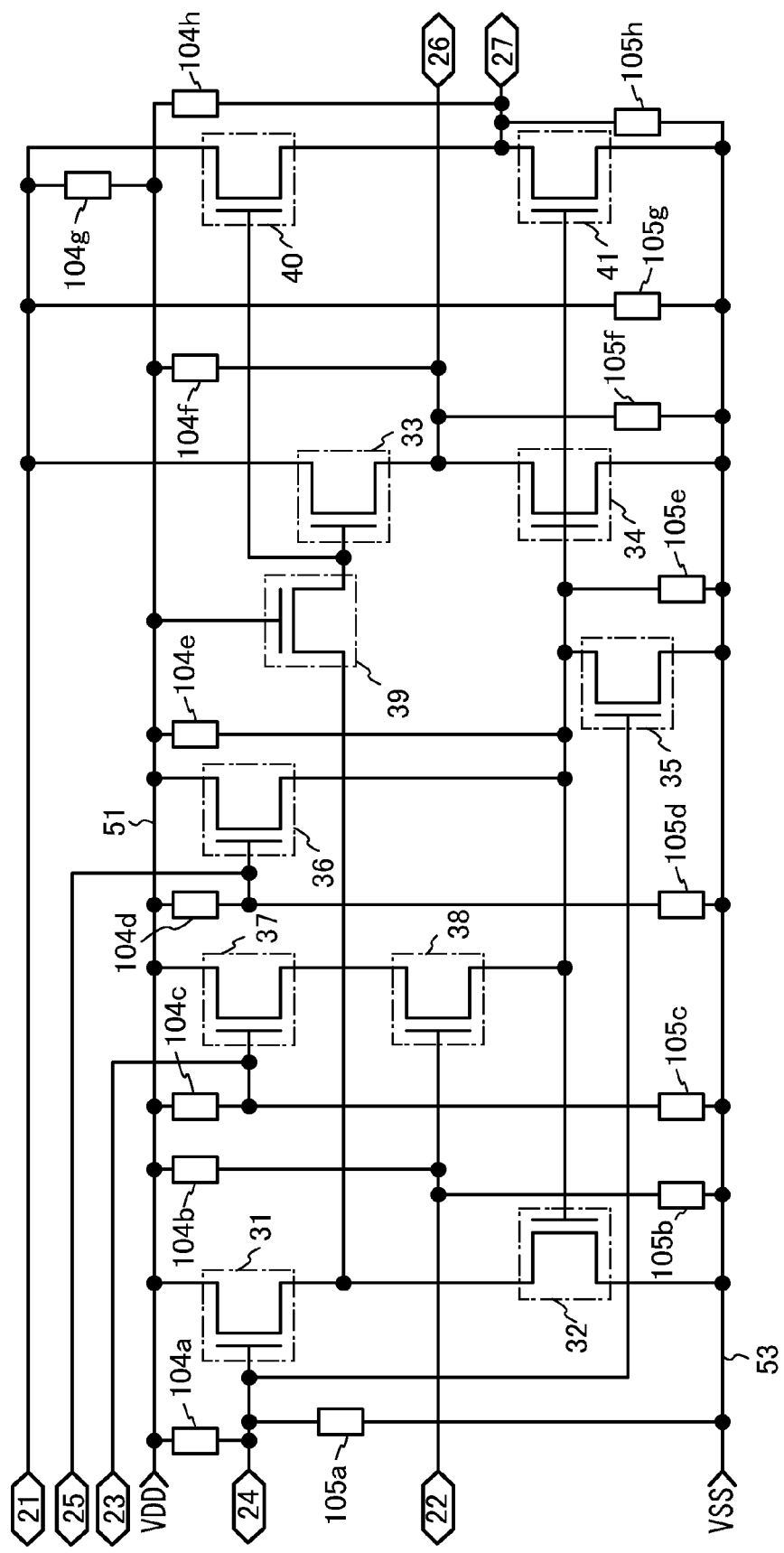
FIG. 6 is a circuit diagram illustrating pulse output circuits included in a driver circuit.

A pulse output circuit in FIG. 6 includes first to eleventh transistors 31 to 41. The pulse output circuit further includes first protection circuits 104a to 104h and second protection circuits 105a to 105h. Each of the first protection circuits 104a to 104h corresponds to the first protection circuit 104 in FIG. 1 or FIG. 2, and each of the second protection circuits 105a to 105h corresponds to the second protection circuit 105 in FIG. 1 or FIG. 2. Signals and power supply potentials are supplied to the first to eleventh transistors 31 to 41 from a power supply line 51 to which a first high power supply potential VDD is supplied and a power supply line 53 to which a low power supply potential VSS is supplied, in addition to from the first to fifth input terminals 21 to 25, the first output terminal 26, and the second output terminal 27, which are described above. As for the relation between power supply potentials of the power supply lines in FIG. 6, the power supply potential VDD is higher than the power supply potential VSS. Note that each of the first to fourth clock signals (CK1) to (CK4) oscillates between an H level signal and an L level signal at regular intervals; the clock signal at the H level is VDD and the clock signal at the L level is VSS. Note that it is possible to provide a power supply line with a power supply potential VCC which is lower than the power supply potential VDD and higher than the power supply potential VSS. By making the potential VCC of the power supply line lower than the potential VDD of the power supply line 51, the potential given to a gate electrode of a transistor can be lowered without affecting the operation, shift in the threshold voltage of the transistor can be reduced, and degradation of the transistor can be suppressed.

Since the source and the drain may change depending on the structure, the operating condition, and the like of the thin film transistor, it is difficult to define which is the source or the drain. Therefore, a region functioning as the source and the drain is not called the source or the drain in some cases. In such a case, for example, one of the source and the drain may be referred to as first terminal and the other thereof may be referred to as second terminal.

In FIG. 6, a first terminal of the first transistor 31 is electrically connected to the power supply line 51, a second terminal of the first transistor 31 is electrically connected to a first terminal of the ninth transistor 39, and a gate electrode of the first transistor 31 is electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 51, a second terminal of the sixth transistor 36 is electrically connected to the gate electrode of the second transistor 32 and the gate electrode of the fourth transistor 34, and a gate electrode of the sixth transistor 36 is electrically connected to the fifth input terminal 25. A first terminal of the seventh transistor 37 is electrically connected to the power supply line 51, a second terminal of the seventh transistor 37 is electrically connected to a second terminal of the eighth transistor 38, and a gate electrode of the seventh transistor 37 is electrically connected to the third input terminal 23. A first terminal of the eighth transistor 38 is electrically connected to the gate electrode of the second transistor 32 and the gate electrode of the fourth transistor 34, and a gate electrode of the eighth transistor 38 is electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to the gate electrode of the third transistor 33 and a gate electrode of the tenth transistor 40, and a gate electrode of the ninth transistor 39 is electrically connected to the power supply line 51. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and the gate electrode of the eleventh transistor 41 is electrically connected to the gate electrode of the second transistor 32 and the gate electrode of the fourth transistor 34.

In the case where the power supply line with the power supply potential VCC is provided, instead of the power supply line 51, the power supply line with the power supply potential VCC is electrically connected to the first terminal of the sixth transistor 36, the first terminal of the seventh transistor 37, and the gate electrode of the ninth transistor 39.

In FIG. 6, the gate electrode of the first transistor 31 is electrically connected between the first protection circuit 104a electrically connected to the power supply line 51 and the second protection circuit 105a electrically connected to the power supply line 53. The gate electrode of the eighth transistor 38 is electrically connected between the first protection circuit 104b electrically connected to the power supply line 51 and the second protection circuit 105b electrically connected to the power supply line 53. The gate electrode of the seventh transistor 37 is electrically connected between the first protection circuit 104c electrically connected to the power supply line 51 and the second protection circuit 105c electrically connected to the power supply line 53. The gate electrode of the sixth transistor 36 is electrically connected between the first protection circuit 104d electrically connected to the power supply line 51 and the second protection circuit 105d electrically connected to the power supply line 53. The gate electrode of the fourth transistor 34 is electrically connected between the first protection circuit 104e electrically connected to the power supply line 51 and the second protection circuit 105e electrically connected to the power supply line 53. Further, the first output terminal 26 is electrically connected between the first protection circuit 104f electrically connected to the power supply line 51 and the second protection circuit 105f electrically connected to the power supply line 53. Further, the first input terminal 21 is electrically connected between the first protection circuit 104g electrically connected to the power supply line 51 and the second protection circuit 105g electrically connected to the power supply line 53. Further, the second output terminal 27 is electrically connected between the first protection circuit 104h electrically connected to the power supply line 51 and the second protection circuit 105h electrically connected to the power supply line 53.

As described above with reference to FIG. 1 and FIG. 2, in the semiconductor element including an electrode or a terminal which is provided between any of the first protection circuits 104a to 104h connected to the power supply line 51 and any of the second protection circuits 105a to 105h connected to the power supply line 53, and in the semiconductor element connected to such an electrode or a terminal, the first protection circuits 104a to 104h or the second protection circuits 105a to 105h serve as discharge paths even when a high surge voltage such as ESD is applied; accordingly, surge current can be prevented from flowing into the semiconductor element.

Note that the first protection circuits 104a to 104h and the second protection circuits 105a to 105h may be provided as needed, and it is not necessary to provide all of them.

In FIG. 6, a portion where the gate electrode of the third transistor 33, the gate electrode of the tenth transistor 40, and the second terminal of the ninth transistor 39 are connected is referred to as node A. In addition, a portion where the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 are connected is referred to as node B.

Figure 7:
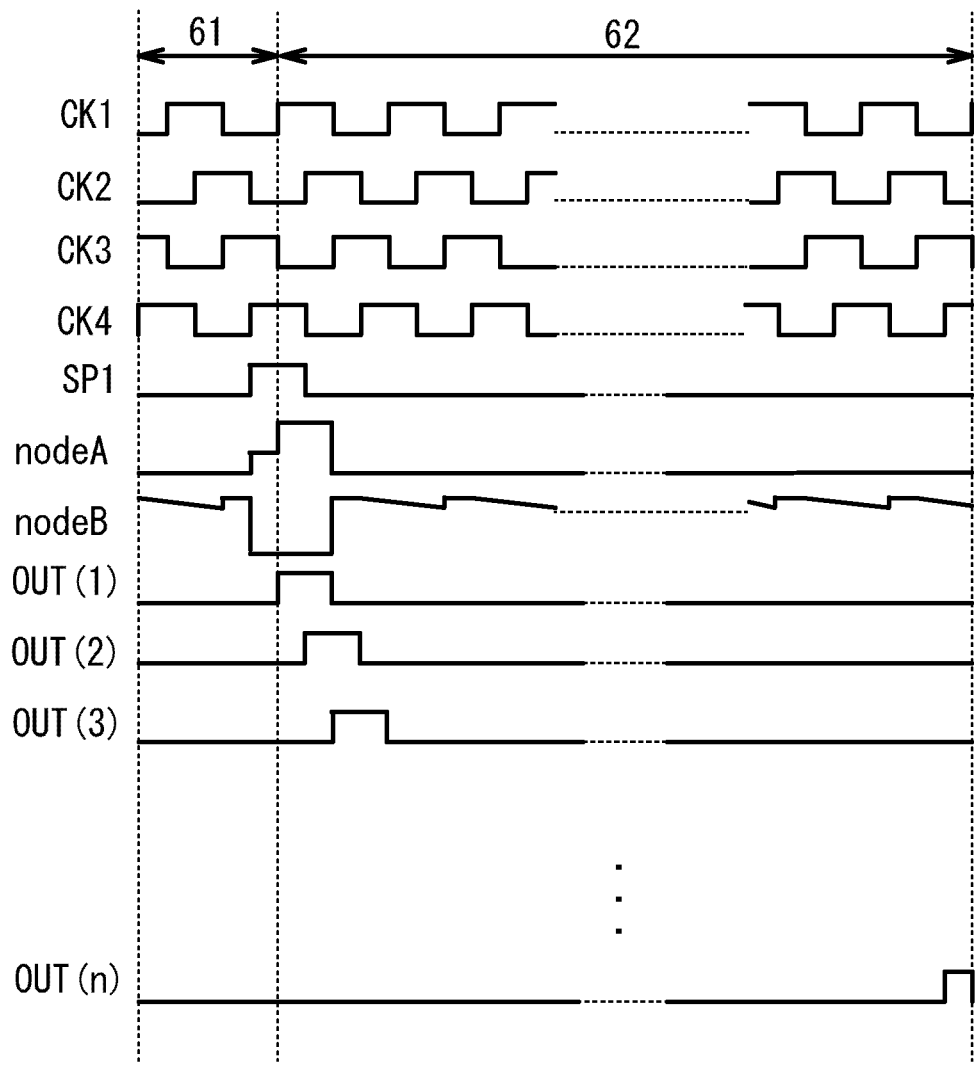
FIG. 7 is a timing chart illustrating operation of a shift register.

FIG. 7 illustrates a timing chart of a shift register including a plurality of pulse output circuits illustrated in FIG. 6. In the case where the shift register is a scan line driver circuit, a period 61 in FIG. 7 is a vertical retrace period and a period 62 is a gate selection period.

Note that by providing the ninth transistor 39 to the gate of which the power supply potential VDD is given as illustrated in FIG. 6, the following advantages before and after the bootstrap operation are provided.

Without the ninth transistor 39 the gate electrode of which is supplied with the power supply potential VDD, when the potential of the node A is raised by bootstrap operation, the potential of a source which is the second terminal of the first transistor 31 increases to a value higher than the power supply potential VDD. Then, the first terminal of the first transistor 31, namely the power supply line 51, becomes to serve as the source thereof. Consequently, in the first transistor 31, a high voltage is applied and thus significant stress is applied between the gate and the source and between the gate and the drain, which might cause degradation of the transistor. By providing the ninth transistor 39 the gate electrode of which is supplied with the power supply potential VDD, the potential of the node A is raised by the bootstrap operation, but at the same time, an increase in the potential of the second terminal of the first transistor 31 can be prevented. In other words, provision of the ninth transistor 39 can lower the level of negative voltage applied between the gate and the source of the first transistor 31. Thus, the circuit configuration in this embodiment can reduce a negative voltage applied between the gate and the source of the first transistor 31, so that degradation of the first transistor 31 due to stress can be suppressed.

Note that the ninth transistor 39 may be provided at any position as long as the first terminal and the second terminal of the ninth transistor 39 are connected between the second terminal of the first transistor 31 and the gate of the third transistor 33. Note that in the case of the shift register including a plurality of pulse output circuits in this embodiment in a signal line driver circuit having a larger number of stages than a scan line driver circuit, the ninth transistor 39 can be omitted, which is advantageous in that the number of transistors is reduced.

When an oxide semiconductor is used for semiconductor layers of the first to eleventh transistor 31 to 41, the off-state current of the thin film transistor can be reduced, the on-state current and field-effect mobility can be increased, and the degree of deterioration can be decreased; therefore, a malfunction in a circuit can be reduced.

Note that even if a wiring connection is changed so that the clock signal which is supplied to the gate electrode of the seventh transistor 37 through the third input terminal 23 and the clock signal which is supplied to the gate electrode of the eighth transistor 38 through the second input terminal 22 are the clock signal which is supplied to the gate electrode of the seventh transistor 37 through the second input terminal 22 and the clock signal which is supplied to the gate electrode of the eighth transistor 38 through the third input terminal 23, respectively, a similar operation effect can be obtained. In the shift register in FIG. 6, a state of the seventh transistor 37 and the eighth transistor 38 is changed such that both the seventh transistor 37 and the eighth transistor 38 are on, then the seventh transistor 37 is off and the eighth transistor 38 is on, and then the seventh transistor 37 and the eighth transistor 38 are off; thus, the fall in potential of the node B due to fall in potentials of the second input terminal 22 and the third input terminal 23 is caused twice by fall in potential of the gate electrode of the seventh transistor 37 and fall in potential of the gate electrode of the eighth transistor 38. On the other hand, in the case where a state of the seventh transistor 37 and the eighth transistor 38 in the shift register in FIG. 6 is changed such that both the seventh transistor 37 and the eighth transistor 38 are turned on, then the seventh transistor 37 is turned on and the eighth transistor 38 is turned off, and then the seventh transistor 37 and the eighth transistor 38 are turned off, the fall in the potential of the node B, which is caused by a fall in potentials of the second input terminal 22 and the third input terminal 23, is caused only once by a fall in the potential of the gate electrode of the eighth transistor 38. Consequently, the connection relation, in which the clock signal CK3 is supplied from the third input terminal 23 to the gate electrode of the seventh transistor 37 and the clock signal CK2 is supplied from the second input terminal 22 to the gate electrode of the eighth transistor 38, is preferable. That is because the number of times of the change in the potential of the node B can be reduced, whereby the noise can be reduced.

In this manner, in a period during which the potentials of the first output terminal 26 and the second output terminal 27 are held at the L level, the H level signal is regularly supplied to the node B; therefore, a malfunction of a pulse output circuit can be suppressed.

The above structure makes it possible to provide a driver circuit which suppresses damage of a semiconductor element due to ESD in a manufacturing process, and a driver circuit provided with a protection circuit with low leakage current.

The structures, the methods, and the like in this embodiment can be combined with each other, or can also be combined with any of structures, methods, and the like in the other embodiments as appropriate.

(Embodiment 2)

In this embodiment, a method of manufacturing the driver circuit described in Embodiment 1 will be described with reference to FIGS. 8A to 8F and FIGS. 9A to 9D. As an example, a method of manufacturing a transistor 440 and a transistor 450 at the same time, which is illustrated in FIGS. 8A to 8F, is described. Here, the transistor 440 corresponds to the transistor 114 included in the first protection circuit 104 in Embodiment 1 and the transistor 450 corresponds to the transistor 111 serving as the semiconductor element 101 in Embodiment 1. Although not shown directly in this embodiment, the transistor 115 included in the second protection circuit 105 in Embodiment 1 can be formed in a manner similar to that for the transistor 440. In the case where a driver circuit portion and a display portion are manufactured over the same substrate as illustrated in FIGS. 3A and 3B, a transistor in the display portion can also be formed in a similar manner.

As illustrated in FIG. 8F, the transistor 440 includes, over a substrate 400 which is provided with an insulating film 420 and has an insulating surface, an oxide semiconductor film 403 including a channel formation region 409, a source region 404a, and a drain region 404b, a source electrode layer 405a, a drain electrode layer 405b, a gate insulating film 402, and a gate electrode layer 401. Further, the transistor 450 includes, over the substrate 400 which is provided with the insulating film 420 and has the insulating surface, an oxide semiconductor film 413 including a channel formation region 419, a source region 414a, and a drain region 414b, a source electrode layer 415a, a drain electrode layer 415b, a wiring layer 415c, a gate insulating film 412, and a gate electrode layer 411.

In the following, steps of manufacturing the transistors 440 and 450 will be described with reference to FIGS. 8A to 8F.

First, the insulating film 420 is formed over the substrate 400 having the insulating surface.

There is no particular limitation on a substrate that can be used as the substrate 400 having the insulating surface as long as it has heat resistance high enough to withstand a heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400, or the substrate provided with a semiconductor element can be used as the substrate 400.

The insulating film 420 can be formed by a plasma CVD method, a sputtering method, or the like using silicon oxide, silicon oxynitride, aluminum oxide, aluminum oxynitride, hafnium oxide, gallium oxide, silicon nitride, silicon nitride oxide, aluminum nitride, aluminum nitride oxide, or a mixed material thereof.

The insulating film 420 has either a single-layer structure or a stacked-layer structure; an oxide insulating film is preferably used as the film to be in contact with the oxide semiconductor film 403. A silicon oxide film is formed by a sputtering method as the insulating film 420 in this embodiment.

Next, an oxide semiconductor film is formed over the insulating film 420 and is patterned into an island shape, so that the oxide semiconductor films 403 and 413 are formed.

The insulating film 420 is in contact with the oxide semiconductor films 403 and 413 and therefore preferably contains a large amount of oxygen which exceeds at least the stoichiometry in (a bulk of) the film. For example, in the case where a silicon oxide film is used as the insulating film 420, the composition formula is $SiO_{2+\alpha}$ ($\alpha>0$). By using the insulating film 420 described above, oxygen can be supplied to the oxide semiconductor films 403 and 413 and favorable characteristics can be obtained. By the supply of oxygen to the oxide semiconductor films 403 and 413, oxygen defects in the film can be filled.

For example, an insulating film containing a large amount of (an excess of) oxygen, which is a supply source of oxygen, may be provided as the insulating film 420 so as to be in contact with the oxide semiconductor films 403 and 413, whereby oxygen can be supplied to the oxide semiconductor films 403 and 413 from the insulating film 420. A heat treatment may be performed in the state where at least part of the oxide semiconductor films 403 and 413 and the insulating film 420 are in contact with each other to supply oxygen to the oxide semiconductor films 403 and 413.

In order that hydrogen or water will not enter the oxide semiconductor films 403 and 413 as much as possible in the formation step of the oxide semiconductor films 403 and 413, it is preferable to heat the substrate provided with the insulating film 420 in a preheating chamber in a sputtering apparatus as a pretreatment for formation of the oxide semiconductor films 403 and 413 so that impurities such as hydrogen and moisture adsorbed onto the substrate and the insulating film 420 are eliminated and exhausted. As an exhaustion unit provided in the preheating chamber, a cryopump is preferable.

An oxide semiconductor used for the oxide semiconductor films 403 and 413 preferably contains at least indium (In) or zinc (Zn). In particular, In and Zn are preferably contained. In addition, as a stabilizer for reducing variations in electric characteristics of a transistor using the oxide semiconductor, the oxide semiconductor preferably contains gallium (Ga) in addition to In and Zn. Alternatively, tin (Sn) is preferably contained as a stabilizer. Alternatively, hafnium (Hf) is preferably contained as a stabilizer. Alternatively, aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, it is possible to use an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide. In this embodiment, IGZO is used as the oxide semiconductor.

Note that here, for example, an "In—Ga—Zn-based oxide" means an oxide containing In, Ga, and Zn as its main component and there is no particular limitation on the ratio of In, Ga, and Zn. The In—Ga—Zn-based oxide may contain a metal element other than the In, Ga, and Zn.

Alternatively, a material represented by $InMO_3(ZnO)_m$ (m>0, m is not an integer) may be used as the oxide semiconductor. Note that M represents one or more metal elements selected from Ga, Fe, Mn, and Co. Alternatively, a material represented by $In_2SnO_5(ZnO)_n$ (n>0, n is a natural number) may be used as the oxide semiconductor.

For example, an In—Ga—Zn-based oxide with an atomic ratio of In:Ga:Zn=1:1:1 (=1/3: 1/3: 1/3), In:Ga:Zn=1:3:2 (=1/6: 1/2: 1/3), In:Ga:Zn=3:1:2 (=1/2: 1/6: 1/3), or In:Ga:Zn=2:2:1 (=2/5: 2/5: 1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the material for the oxide semiconductor is not limited to the materials given above, and a material with an appropriate composition may be used depending on needed semiconductor characteristics (e.g., mobility, threshold voltage, and variations). In order to obtain the needed semiconductor characteristics, it is preferable that the carrier concentration, the impurity concentration, the defect density, the atomic ratio between a metal element and oxygen, the interatomic distance, the density, and the like be set to appropriate values.

For example, high mobility can be obtained relatively easily in the case of using an In—Sn—Zn-based oxide. However, mobility can be increased by reducing the defect density in a bulk also in the case of using an In—Ga—Zn-based oxide.

Note that for example, the expression "the composition of an oxide containing In, Ga, and Zn at an atomic ratio of In:Ga:Zn=a:b:c (a+b+c=1), is in the neighborhood of the composition of an oxide including In, Ga, and Zn at an atomic ratio of In:Ga:Zn=A:B:C (A+B+C=1)" means that a, b, and c satisfy the following relation: $(a-A)^2+(b-B)^2+(c-C)^2 \leq r^2$. For example, r may be 0.05. The same applies to other oxides.

The oxide semiconductor film can have a single-layer structure or a stacked-layer structure of two or more layers. In the case of the stacked-layer structure, oxide semiconductor layers included in the oxide semiconductor film may have different energy gaps or substantially the same energy gap. For example, in the case where the oxide semiconductor film includes a first oxide semiconductor layer, a second oxide semiconductor layer, and a third oxide semiconductor layer which are stacked in this order, the second oxide semiconductor layer has a narrow energy gap and is placed between the first and third oxide semiconductor layers which each have a wide energy gap, whereby an effect of reducing the off-state current (leakage current) of the transistor can be enhanced.

The oxide semiconductor may be single crystal or non-single-crystal. In the latter case, the oxide semiconductor may be amorphous or polycrystal. Further, the oxide semiconductor may have an amorphous structure including a portion having crystallinity or a non-amorphous structure.

An oxide semiconductor in an amorphous state can have a flat surface with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced, and when a surface is flatter, mobility higher than that of an oxide semiconductor layer in an amorphous state can be obtained. To make the surface flatter, the oxide semiconductor is preferably formed over a flat surface. Specifically, the oxide semiconductor may be formed over a surface with an average surface roughness ($R_a$) of less than or equal to 1 nm, preferably less than or equal to 0.3 nm, more preferably less than or equal to 0.1 nm.

Note that, $R_a$ is obtained by three-dimension expansion of arithmetic mean surface roughness that is defined by JIS B 0601:2001 (ISO 4287:1997) so that $R_a$ can be applied to a curved surface. $R_a$ is an "average value of the absolute values of deviations from a reference surface to a specific surface" and is defined by the following equation.

$$Ra = \frac{1}{S_0} \int_{y_1}^{y_2} \int_{x_1}^{x_2} |f(x, y) - Z_0| dx dy \qquad \text{[EQUATION 1]}$$

Here, the specific surface is a surface which is a target of roughness measurement, and is a quadrilateral region which is specified by four points represented by the coordinates ($x_1$, $y_1$, $f(x_1, y_1)$), ($x_1$, $y_2$, $f(x_1, y_2)$), ($x_2$, $y_1$, $f(x_2, y_1)$), and ($x_2$, $y_2$, $f(x_2, y_2)$). Moreover, $S_0$ represents the area of a rectangle which is obtained by projecting the specific surface on the xy plane, and $Z_0$ represents the height of the reference surface (the average height of the specific surface). Further, $R_a$ can be measured using an atomic force microscope (AFM).

Therefore, a planarization treatment may be performed on regions of the insulating film 420, which are to be in contact with the oxide semiconductor films 403 and 413 formed later. The planarization treatment may be, but are not particularly limited to, a polishing treatment (such as chemical mechanical polishing (CMP)), a dry etching treatment, or a plasma treatment.

As a plasma treatment, reverse sputtering in which an argon gas is introduced and plasma is generated can be performed. The reverse sputtering is a method in which voltage is applied to a substrate side with the use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the insulating film 420.

As the planarization treatment, a polishing treatment, a dry etching treatment, or a plasma treatment may be performed plural times, or these treatments may be performed in combination. In the case where the treatments are combined, the order of steps may be set as appropriate, without particular limitation, depending on the unevenness of the surface of the insulating film 420.

An oxide semiconductor film including a crystal and having crystallinity (crystalline oxide semiconductor film) can be used as each of the oxide semiconductor films 403 and 413. Crystals in the crystalline oxide semiconductor film may have random or regularly aligned crystal axes.

For example, as the crystalline oxide semiconductor film, a CAAC-OS (c-axis aligned crystalline oxide semiconductor) film including crystals c-axes of which are substantially perpendicular to the surface can be used.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of the surface of the CAAC-OS film, a triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of the surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing a treatment for crystallization such as a heat treatment after film formation.

With the use of the CAAC-OS film in a transistor, change in electric characteristics of the transistor due to irradiation with visible light or ultraviolet light can be reduced. Thus, the transistor has high reliability.

Note that part of oxygen included in the oxide semiconductor film may be substituted with nitrogen.

In an oxide semiconductor having a crystal part like the CAAC-OS, defects in the bulk can be further reduced, and when the surface of the oxide semiconductor is flatter, mobility higher than that of an oxide semiconductor in an amorphous state can be obtained. To make the surface flatter, the oxide semiconductor is preferably formed over a flat surface. Specifically, the oxide semiconductor may be formed over a surface with the average surface roughness ($R_a$) of less than or equal to 1 nm, preferably less than or equal to 0.3 nm, more preferably less than or equal to 0.1 nm.

The oxide semiconductor films 403 and 413 have a thickness ranging from 1 nm to 200 nm (preferably from 5 nm to 30 nm) and can be formed by a sputtering method, a molecular beam epitaxy (MBE) method, a CVD method, a pulse laser deposition method, an atomic layer deposition (ALD) method, or the like as appropriate. The oxide semiconductor films 403 and 413 may be formed using a sputtering apparatus which performs film formation with surfaces of a plurality of substrates set substantially perpendicular to a surface of a sputtering target, which is what is called a columnar plasma (CP) sputtering system.

Note that it is preferable that the oxide semiconductor film be formed under a condition that much oxygen is contained during film formation (e.g., formed by a sputtering method in a 100% oxygen atmosphere), so that a film containing much oxygen (preferably including a region where the oxygen content is higher than that in the stoichiometry of the oxide semiconductor in a crystalline state) is formed.

As a target for forming the oxide semiconductor film by a sputtering method, for example, a metal oxide target having a composition ratio of $In_2O_3:Ga_2O_3:ZnO=1:1:2$ [molar ratio] is used to form an In—Ga—Zn-based oxide film. The material and the component of the target are not limited to be above; for example, a metal oxide target having a composition ratio of $In_2O_3:Ga_2O_3:ZnO=1:1:1$ [molar ratio] may be used.

The filling factor of the metal oxide target is greater than or equal to 90% and less than or equal to 100%, preferably greater than or equal to 95% and less than or equal to 99.9%. With the use of the metal oxide target with high filling factor, a dense oxide semiconductor film can be formed.

It is preferable that a high-purity gas from which impurity such as hydrogen, water, a hydroxyl group, or hydride is removed be used as a sputtering gas for the formation of the oxide semiconductor film.

The substrate is held in a film formation chamber kept under reduced pressure. Then, moisture remaining in the film formation chamber is removed, a sputtering gas from which hydrogen and moisture are removed is introduced, and the above target is used, so that the oxide semiconductor film is formed over the substrate 400. To remove moisture remaining in the film formation chamber, an entrapment vacuum pump such as a cryopump, an ion pump, or a titanium sublimation pump is preferably used. As an exhaustion unit, a turbo molecular pump to which a cold trap is added may be used. In the film formation chamber which is exhausted with the cryopump, a hydrogen atom, a compound containing a hydrogen atom, such as water ($H_2O$) (more preferably, also a compound containing a carbon atom), and the like are removed, whereby the concentration of an impurity in the oxide semiconductor film formed in the film formation chamber can be reduced.

The insulating film 420 and the oxide semiconductor film are preferably formed in succession without exposure to the air. When the insulating film 420 and the oxide semiconductor film are formed in succession without exposure to the air, impurities such as hydrogen and moisture can be prevented from being adsorbed onto a surface of the insulating film 420.

In the case where a CAAC-OS film is used as the oxide semiconductor film 403 and the oxide semiconductor film 413, for example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y and Z are given positive numbers. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Further, a heat treatment may be performed on the oxide semiconductor film in order to remove excess hydrogen (including water and a hydroxyl group) (to perform dehydration or dehydrogenation). The temperature of the heat treatment is higher than or equal to 300° C. and lower than or equal to 700° C., or lower than the strain point of the substrate. The heat treatment can be performed under reduced pressure, a nitrogen atmosphere, or the like. For example, after the substrate is put in an electric furnace which is a kind of heat treatment apparatus, the oxide semiconductor film is subjected to a heat treatment at 450° C. for one hour in a nitrogen atmosphere.

Note that a heat treatment apparatus used is not limited to an electric furnace, and a device for heating a process object by heat conduction or heat radiation from a heater such as a resistance heater may alternatively be used. For example, an RTA (rapid thermal anneal) apparatus such as a GRTA (gas rapid thermal anneal) apparatus or an LRTA (lamp rapid thermal anneal) apparatus can be used. A GRTA apparatus is an apparatus for a heat treatment using a high-temperature gas. As the high-temperature gas, an inert gas which does not react with the process object in a heat treatment, such as nitrogen or a rare gas like argon, is used. An LRTA apparatus is an apparatus for heating the process object by radiation of light (electromagnetic wave) emitted from a lamp such as a halogen lamp, a metal halide lamp, a xenon arc lamp, a carbon arc lamp, a high pressure sodium lamp, or a high pressure mercury lamp.

For example, as the heat treatment, GRTA may be performed as follows. The substrate is put in an inert gas heated at a high temperature of 650° C. to 700° C., is heated for several minutes, and is taken out of the inert gas.

The heat treatment for dehydration or dehydrogenation may be performed at any timing in the process of manufacturing the transistors 440 and 450 as long as it is after the formation of the oxide semiconductor films 403 and 413, during formation of a metal-element-containing film, or before the introduction of oxygen into the oxide semiconductor films 403 and 413.

The heat treatment for dehydration or dehydrogenation is preferably performed before the oxide semiconductor film is processed into an island shape, whereby oxygen contained in the insulating film 420 can be prevented from being released by the heat treatment.

Note that in the heat treatment, it is preferable that water, hydrogen, and the like be not contained in nitrogen or a rare gas such as helium, neon, or argon. The purity of nitrogen or the rare gas such as helium, neon, or argon which is introduced into the heat treatment apparatus is preferably 6N (99.9999%) or higher, more preferably 7N (99.99999%) or higher (that is, the impurity concentration is preferably 1 ppm or lower, more preferably 0.1 ppm or lower).

In addition, after the oxide semiconductor film is heated by the heat treatment, a high-purity oxygen gas, a high-purity $N_2O$ gas, or ultra dry air (the moisture amount is 20 ppm (−55° C. by conversion into a dew point) or less, preferably 1 ppm or less, more preferably 10 ppb or less, in the measurement with the use of a dew point meter of a cavity ring down laser spectroscopy (CRDS) system) may be introduced into the same furnace. It is preferable that water, hydrogen, and the like be not contained in the oxygen gas or the $N_2O$ gas. The purity of the oxygen gas or the $N_2O$ gas which is introduced into the heat treatment apparatus is preferably 6N or higher, more preferably 7N or higher (that is, the impurity concentration in the oxygen gas or the $N_2O$ gas is preferably 1 ppm or lower, more preferably 0.1 ppm or lower). The oxygen gas or the $N_2O$ gas acts to supply oxygen that is a main component of the oxide semiconductor and that is reduced by the step for removing an impurity for the dehydration or dehydrogenation, so that the oxide semiconductor film can be a highly purified, electrically i-type (intrinsic) oxide semiconductor film.

The oxide semiconductor films 403 and 413 are formed by processing the formed oxide semiconductor film into island shapes through a photolithography step. A resist mask for forming the island-shaped oxide semiconductor films 403 and 413 may be formed by an inkjet method. Formation of the resist mask by an inkjet method needs no photomask; thus, manufacturing cost can be reduced.

Note that the etching of the oxide semiconductor film may be dry etching, wet etching, or both dry etching and wet etching. As an etchant used for wet etching of the oxide semiconductor film, for example, a mixed solution of phosphoric acid, acetic acid, and nitric acid, or the like can be used. In addition, ITO07N (produced by KANTO CHEMICAL CO., INC.) may also be used.

Further, an element isolation region formed of an insulating film for isolating the oxide semiconductor film per element may be provided.

Next, a gate insulating film 422 is formed over the oxide semiconductor films 403 and 413.

The surfaces of the oxide semiconductor films 403 and 413 may also be subjected to the above planarization treatment in order to be more favorably covered with the gate insulating film 422. The surfaces of the oxide semiconductor films 403 and 413 are preferably flat particularly in the case where a thin insulating film is used as the gate insulating film 422.

The gate insulating film 422 can have a thickness of 1 nm to 100 nm and can be formed by a sputtering method, an MBE method, a CVD method, a pulse laser deposition method, an ALD method, or the like as appropriate. The gate insulating film 422 may be formed using a sputtering apparatus which performs film formation with surfaces of a plurality of substrates set substantially perpendicular to a surface of a sputtering target, which is what is called a columnar plasma (CP) sputtering system.

The gate insulating film 422 can be formed using a silicon oxide film, a gallium oxide film, an aluminum oxide film, a silicon nitride film, a silicon oxynitride film, an aluminum oxynitride film, or a silicon nitride oxide film. The gate insulating film 422 preferably contains oxygen in a portion which is in contact with the oxide semiconductor films 403 and 413. In particular, the gate insulating film 422 preferably contains a large amount of oxygen which exceeds at least the stoichiometry in (a bulk of) the film. For example, in the case where a silicon oxide film is used as the gate insulating film 422, the composition formula is $SiO_{2+\alpha}$ ($\alpha>0$). In this embodiment, a silicon oxide film of $SiO_{2+\alpha}$ ($\alpha>0$) is used as the gate insulating film 422. By using the silicon oxide film as the gate insulating film 422, oxygen can be supplied to the oxide semiconductor films 403 and 413 and favorable characteristics can be obtained. Further, the gate insulating film 422 is preferably formed in consideration of the size of a transistor to be formed and the step coverage with the gate insulating film 422.

The gate insulating film 422 can be formed using a high-k material such as hafnium oxide, yttrium oxide, hafnium silicate ($HfSi_xO_y$ ($x>0$, $y>0$)), hafnium silicate to which nitrogen is added ($HfSiO_xN_y$ ($x>0$, $y>0$)), hafnium aluminate ($HfAl_xO_y$ ($x>0$, $y>0$)), or lanthanum oxide, whereby gate leakage current can be reduced. Further, the gate insulating film 422 may have a single-layer structure or a stacked-layer structure.

Next, a conductive film is formed by a plasma CVD method or a sputtering method, and is selectively patterned to form the gate electrode layers 401 and 411 over the gate insulating film 422 (see FIG. 8A). The gate electrode layers 401 and 411 can be formed using a metal material such as molybdenum, titanium, tantalum, tungsten, copper, chromium, neodymium, or scandium or an alloy material which contains any of these materials as its main component. Alternatively, a semiconductor film typified by a polycrystalline silicon film doped with an impurity element such as phosphorus, or a silicide film such as a nickel silicide film may be used as the gate electrode layers 401 and 411. The gate electrode layers 401 and 411 have a single-layer structure or a stacked-layer structure. In this embodiment, the gate electrode layers 401 and 411 are formed using tungsten.

The gate electrode layers 401 and 411 can also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. Each of the gate electrode layers 401 and 411 can have a stacked-layer structure of the above conductive material and the above metal material.

As one layer in a stacked-layer structure of each of the gate electrode layers 401 and 411, which is in contact with the gate insulating film 422, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function of 5 eV or higher, preferably 5.5 eV or higher; thus, any of these films used as the gate electrode layer enables the threshold voltage of the transistor to be positive, so that what is called a normally-off switching element can be provided.

Next, the gate insulating film 422 is etched with the use of the gate electrode layers 401 and 411 as masks, so that part of the oxide semiconductor films 403 and 413 is exposed and the gate insulating films 402 and 412 are formed (see FIG. 8B).

Then, a metal-element-containing film 424 is formed over the oxide semiconductor films 403 and 413, the gate insulating films 402 and 412, and the gate electrode layers 401 and 411 to be in contact with part of the oxide semiconductor films 403 and 413 while the substrate 400 is heated (see FIG. 8C). The heating temperature for formation of the metal-element-containing film 424 is in the range of 100° C. to 700° C., preferably 200° C. to 400° C.

Examples of the metal-element-containing film 424 include a metal film, a metal oxide film, a metal nitride film, and the like. Note that the metal element contained in the metal-element-containing film 424 is different from the metal element contained in the channel formation region 409 in the oxide semiconductor film 403 and the channel formation region 419 in the oxide semiconductor film 413.

As the metal element included in the metal-element-containing film 424, one or more selected from aluminum (Al), titanium (Ti), molybdenum (Mo), tungsten (W), hafnium (Hf), tantalum (Ta), lanthanum (La), barium (Ba), magnesium (Mg), zirconium (Zr), and nickel (Ni) can be used. As the metal-element-containing film 424, a metal film, a metal oxide film, or a metal nitride film containing at least one of the above-described metal elements (such a metal nitride film is, for example, a titanium nitride film, a molybdenum nitride film, or a tungsten nitride film) can be used. Further, the metal-element-containing film 424 may contain a dopant such as phosphorus (P) or boron (B). In this embodiment, the metal-element-containing film 424 has electrical conductivity.

The metal-element-containing film 424 can be formed by a plasma-enhanced CVD method, a sputtering method, an evaporation method, or the like. The thickness of the metal-element-containing film 424 may be greater than or equal to 5 nm and less than or equal to 30 nm.

In this embodiment, an aluminum film is formed to a thickness of 10 nm by a sputtering method as the metal-element-containing film 424.

The thermal deposition may be performed under an atmosphere of nitrogen, ultra-dry air (air in which the water content is 20 ppm or lower, preferably 1 ppm or lower, more preferably 10 ppb or lower), or a rare gas (argon, helium, or the like). Note that it is preferable that water, hydrogen, and the like be not contained in the atmosphere of nitrogen, ultra-dry air, or a rare gas. The purity of nitrogen or a rare gas which is introduced into a heat treatment apparatus is preferably 6N (99.9999%) or higher, more preferably 7N (99.99999%) or higher (that is, the impurity concentration is 1 ppm or lower, preferably 0.1 ppm or lower). Alternatively, the thermal deposition may be performed under reduced pressure or in a vacuum.

By the thermal deposition of the metal-element-containing film 424, the metal element(s) contained in the metal-element-containing film 424 is introduced into the oxide semiconductor films 403 and 413. Thus, the channel formation region 409 is formed in a region of the oxide semiconductor film 403, which overlaps with the gate electrode layer 401, and the source region 404a and the drain region 404b are formed in regions between which the channel formation region 409 is interposed in the channel length direction. The source region 404a and the drain region 404b contain the metal element(s) and have a lower resistance than the channel formation region 409. Similarly, the channel formation region 419, and the source region 414a and the drain region 414b which contain the metal element(s) and have a lower resistance than the channel formation region 419 are formed in the oxide semiconductor film 413.

The source region 404a and the drain region 404b having a lower resistance than the channel formation region 409 are formed entirely in the thickness direction of the oxide semiconductor film 403 in FIG. 8C, but are not always formed in that manner. The source region 404a and the drain region 404b might be formed in part of the oxide semiconductor film 403, i.e., near the surfaces thereof. The same applies to the source region 414a and the drain region 414b formed in the oxide semiconductor film 413.

Next, with the use of the gate insulating films 402 and 412 and the gate electrode layers 401 and 411 as masks, a dopant 421 may be selectively introduced into the oxide semiconductor films 403 and 413 through the metal-element-containing film 424 so that the resistance of the source regions 404a and 414a and the drain regions 404b and 414b can be even lower (see FIG. 8D).

The dopant 421 is an impurity by which the electrical conductivity of the oxide semiconductor films 403 and 413 is changed. As the dopant 421, one or more selected from the following can be used: Group 15 elements (typical examples thereof are phosphorus (P), arsenic (As), and antimony (Sb)), boron (B), aluminum (Al), nitrogen (N), argon (Ar), helium (He), neon (Ne), indium (In), fluorine (F), chlorine (Cl), titanium (Ti), and zinc (Zn).

The dopant may be contained in the metal-element-containing film 424.

The dopant 421 is introduced into the oxide semiconductor films 403 and 413 through the metal-element-containing film 424 by an implantation method. The dopant 421 can be introduced by an ion implantation method, an ion doping method, a plasma immersion ion implantation method, or the like. In that case, it is preferable to use a single ion of the dopant 421 or a hydride ion, a fluoride ion, or a chloride ion.

The introduction of the dopant 421 may be controlled by setting the addition conditions such as the accelerated voltage and the dosage, or the thickness of the metal-element-containing film 424 through which the dopant 421 passes, as appropriate.

For example, for introduction of an boron ion by an ion implantation method using boron, the accelerated voltage and the dosage may be set to 15 kV and $1 \times 10^{15}$ ions/cm$^2$, respectively. The dosage is preferably set to be greater than or equal to $1 \times 10^{13}$ ions/cm$^2$ and less than or equal to $5 \times 10^{16}$ ions/cm$^2$.

The concentration of the dopant 421 in the source region or the drain region is preferably higher than or equal to $5 \times 10^{18}$/cm$^3$ and lower than or equal to $1 \times 10^{22}$/cm$^3$.

The introduction of the dopant 421 into the oxide semiconductor films 403 and 413 may be performed plural times, and the number of kinds of dopant may be plural.

Further, a heat treatment may be performed after the introduction of the dopant 421. The heat treatment is preferably performed at a temperature(s) higher than or equal to 300° C. and lower than or equal to 700° C. (further preferably higher than or equal to 300° C. and lower than or equal to 450° C.) in a nitrogen atmosphere, or under reduced pressure or air (ultra dry air).

In the case where the oxide semiconductor films 403 and 413 are crystalline oxide semiconductor films, the oxide semiconductor films 403 and 413 may be partly amorphized by the introduction of the dopant 421. In that case, the crystallinity of the oxide semiconductor films 403 and 413 can be recovered by performing a heat treatment thereon after the introduction of the dopant 421.

Note that the introduction of the dopant is performed to further lower the resistance of the source regions 404a and 414a and the drain regions 404b and 414b, but is not always performed in the manufacture of the transistors 440 and 450.

Next, the metal-element-containing film 424 is removed by wet etching (see FIG. 8E). In the case where tungsten is used for the gate electrode layers 401 and 411, IGZO is used for the oxide semiconductor films 403 and 413, and aluminum is used for the metal-element-containing film 424, as in this embodiment, it is preferable to use an organic alkali aqueous solution containing 0.2% to 5.0% of tetra methyl ammonium hydroxide (TMAH) (e.g., product name NMD3 produced by TOKYO OHKA KOGYO CO., LTD). By performing wet etching in this manner, the metal-element-containing film 424 can be removed with higher etching rate than the gate electrode layers 401 and 411 and the oxide semiconductor films 403 and 413.

Needless to say, conditions for the wet etching are not limited to the above condition, and may be set as appropriate according to the kinds of gate electrode layers 401 and 411, oxide semiconductor films 403 and 413, and a metal-element-containing film 424, and the like.

By removing the metal-element-containing film 424 by wet etching in that manner, the metal-element-containing film 424 can be removed without performing a plasma treatment. Thus, it is possible to prevent damage of the transistor 450 included in a driver circuit owing to ESD generated by plasma damage before formation of the first protection circuit 104 and the second protection circuit 105.

Then, an insulating film 425 is formed to cover the transistors 440 and 450.

The insulating film 425 is preferably formed by a method such as a sputtering method, in which impurities such as water and hydrogen does not enter the insulating film 425, as appropriate. It is preferable that the insulating film 425 include much oxygen because it serves as a supply source of oxygen to the oxide semiconductor films 403 and 413.

In this embodiment, a silicon oxide film is formed to a thickness of 100 nm as the insulating film 425 by a sputtering method. The silicon oxide film can be formed by a sputtering method in a rare gas (typically, argon) atmosphere, an oxygen atmosphere, or a mixed atmosphere containing a rare gas and oxygen.

To remove residual moisture from the film formation chamber of the insulating film 425 in a manner similar to that of the formation of the oxide semiconductor film, an entrapment vacuum pump (such as a cryopump) is preferably used. When the insulating film 425 is formed in the film formation chamber exhausted using a cryopump, the impurity concentration in the insulating film 425 can be reduced. As an exhaustion unit for removing moisture remaining in the film formation chamber of the insulating film 425, a turbo molecular pump provided with a cold trap may be used.

A high-purity gas from which impurities such as hydrogen, water, a hydroxyl group, and hydride are removed is preferably used as a sputtering gas used in the formation of the insulating film 425.

In the case where the insulating film 425 has a stacked-layer structure, a silicon oxide film and an inorganic insulating film such as, typically, an aluminum oxide film, a silicon oxynitride film, an aluminum oxynitride film, or a gallium oxide film can be used. For example, as the insulating film 425, a stacked layer including a silicon oxide film and an aluminum oxide film can be used.

Further, to reduce surface unevenness caused by a transistor, an insulating film 426 serving as a planarization insulating film may be formed. For the insulating film 426, an organic material such as a polyimide-based resin, an acrylic-based resin, or a benzocyclobutene-based resin can be used. Other than such organic materials, it is also possible to use a low-dielectric constant material (low-k material) or the like. Alternatively, the insulating film 426 may be formed by stacking plural insulating films formed using any of these materials.

Note that after the insulating film 425 is formed, a heat treatment may be performed in an inert gas atmosphere or an oxygen atmosphere. The heat treatment temperature is preferably higher than or equal to 200° C. and lower than or equal to 450° C., and more preferably higher than or equal to 250° C. and lower than or equal to 350° C. With such a heat treatment, variations in electric characteristics of the transistors 440 and 450 can be reduced. Further, in the case where the insulating film 420, the gate insulating films 402 and 412, or the insulating film 425 contain(s) oxygen, oxygen can be supplied to the oxide semiconductor films 403 and 413 to fill oxygen defects in the oxide semiconductor films 403 and 413. As described above, the heat treatment has an effect of supplying oxygen; therefore, the heat treatment can also be referred to as supply of oxygen. Note that the supply of oxygen can also be performed through a heat treatment on the metal-element-containing film 424 or a heat treatment after the addition of the dopant 421.

Lastly, openings reaching the gate electrode layers 401 and 411, the source regions 404a and 414a, and the drain regions 404b and 414b are formed in the insulating films 425 and 426. Over the insulating films 425 and 426 and through the openings, the source electrode layer 405a is formed to be in contact with the source region 404a and the gate electrode layer 401, the drain electrode layer 405b is formed to be in contact with the drain region 404b, the source electrode layer 415a is formed to be in contact with the source region 414a, the drain electrode layer 415b is formed to be in contact with the drain region 414b, and the wiring layer 415c is formed to be in contact with the gate electrode layer 411 (see FIG. 8F).

As a conductive film used for the source electrode layers 405a and 415a, the drain electrode layers 405b and 415b, and the wiring layer 415c, for example, a metal film containing an element selected from Al, Cr, Cu, Ta, Ti, Mo, and W or a metal nitride film containing any of the above elements (e.g., a titanium nitride film, a molybdenum nitride film, or a tungsten nitride film) can be used. A metal film having a high melting point such as Ti, Mo, W, or the like or a metal nitride film of any of these elements (e.g., a titanium nitride film, a molybdenum nitride film, or a tungsten nitride film) may be stacked on one or both of a lower side and an upper side of a metal film of Al, Cu, or the like.

Even when a high surge voltage such as ESD is applied to the transistor 111 (transistor 450) in the formation of the source electrode layers 405a and 415a, the drain electrode layers 405b and 415b, and the wiring layer 415c, as described in Embodiment 1, the first protection circuit 104 including the transistor 114 or the second protection circuit 105 including the transistor 115 serves as a discharge path, thereby preventing surge current from flowing into the transistor 111.

A resist mask is formed over the conductive film through a photolithography step and selective etching is performed so that the source electrode layers 405a and 415a, the drain electrode layers 405b and 415b, and the wiring layer 415c can be formed.

In the above manner, the transistor 440 including the oxide semiconductor film 403 including the channel formation region 409, the source region 404a, and the drain region 404b, the source electrode layer 405a, the drain electrode layer 405b, the gate insulating film 402, and the gate electrode layer 401, and the transistor 450 including the oxide semiconductor film 413 including the channel formation region 419, the source region 414a, and the drain region 414b, the source electrode layer 415a, the drain electrode layer 415b, the wiring layer 415c, the gate insulating film 412, and the gate electrode layer 411 can be formed at the same time.

In a manner similar to that in FIG. 1, the source electrode layer 405a is electrically connected to the wiring layer 415c, and the drain electrode layer 405b is electrically connected to the first wiring 102. In the case where the transistor 115 included in the second protection circuit 105 in FIG. 1, not the transistor 114, is formed by the method in FIGS. 8A to 8F, the drain electrode layer 405b is electrically connected to the wiring layer 415c, and the source electrode layer 405a is electrically connected to the second wiring 103 in FIG. 1.

The driver circuit in Embodiment 1 can alternatively be formed by a method different from the method in FIGS. 8A to 8F. An example in which the transistors 440 and 450 are formed at the same time by a method different from that in FIGS. 8A to 8F will be described with reference to FIGS. 9A to 9D.

First, as in the state in FIG. 8B, over the substrate 400, the insulating film 420, the oxide semiconductor films 403 and 413, the gate insulating films 402 and 412, and the gate electrode layers 401 and 411 are formed. The above description can be referred to for the details.

Figure 9A:
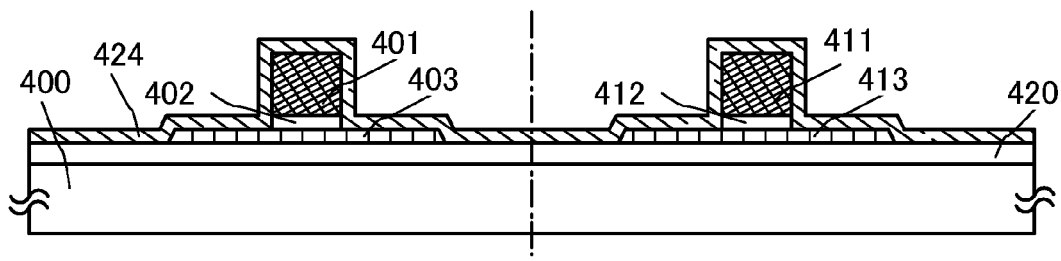
FIGS. 9A to 9D are cross-sectional views illustrating a method of manufacturing a protection circuit used in a driver circuit.

Then, the metal-element-containing film 424 is formed over the oxide semiconductor films 403 and 413, the gate insulating films 402 and 412, and the gate electrode layers 401 and 411 to be in contact with part of the oxide semiconductor films 403 and 413 (see FIG. 9A). Although the metal-element-containing film 424 is formed while the substrate 400 is heated in the step in FIG. 8C, the substrate 400 in this step is not heated or is heated at a temperature such that the metal element(s) in the metal-element-containing film 424 is not introduced into the oxide semiconductor films 403 and 413, for example, at lower than 100° C.

Here, the metal-element-containing film 424 can be formed using a material and a method similar to those in the description for FIG. 8C.

Figure 9B:
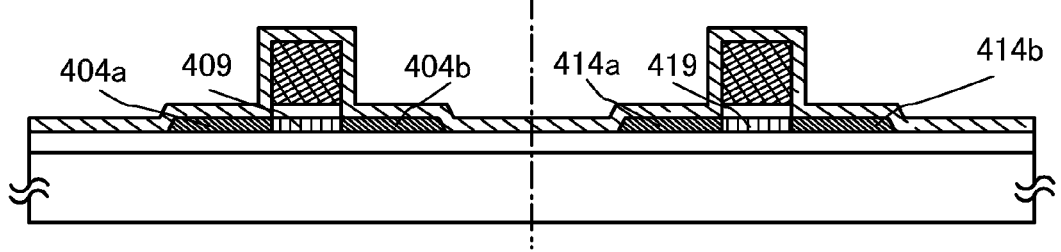
Figure 9C:
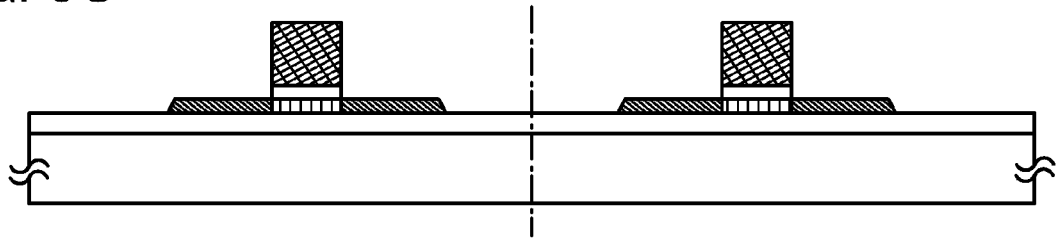
Figure 9D:
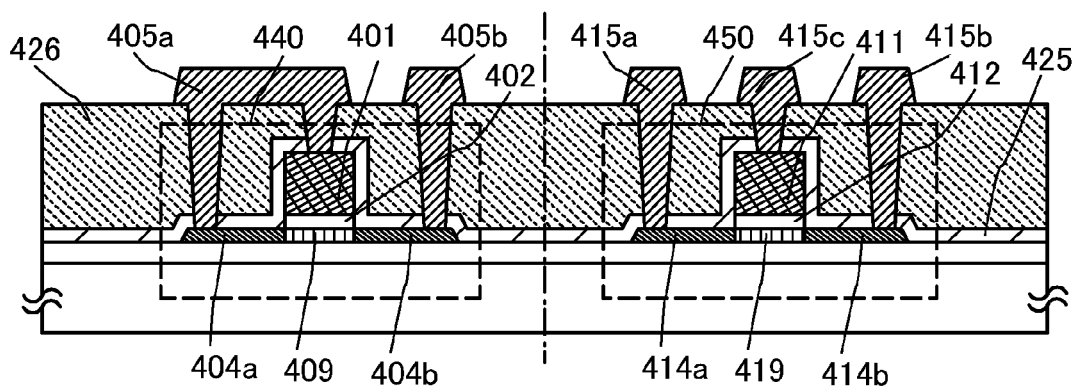

Next, a heat treatment is performed in a state where part of the oxide semiconductor films 403 and 413 is in contact with the metal-element-containing film 424 (see FIG. 9B). Here, the heating temperature is higher than or equal to 100° C. and lower than or equal to 700° C., preferably higher than or equal to 200° C. and lower than or equal to 400° C.

For example, after the substrate is put in an electric furnace which is a kind of heat treatment apparatus, the metal-element-containing film 424 and the oxide semiconductor films 403 and 413 are subjected to a heat treatment at 300° C. for one hour in an inert gas atmosphere.

Note that a heat treatment apparatus used is not limited to an electric furnace, and a device for heating a process object by heat conduction or heat radiation from a heater such as a resistance heater may alternatively be used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating a process object by radiation of light (electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for a heat treatment using a high-temperature gas. As the high-temperature gas, an inert gas which does not react with a process object by a heat treatment, such as nitrogen or a rare gas like argon, is used.

For example, as the heat treatment, GRTA may be performed as follows. The substrate is put in an inert gas heated at a high temperature(s) of 650° C. to 700° C., is heated for several minutes, and is taken out of the inert gas.

The heat treatment may be performed in an atmosphere of nitrogen, ultra-dry air (air in which the water content is 20 ppm or lower, preferably 1 ppm or lower, more preferably 10 ppb or lower), or a rare gas (argon, helium, or the like). Note that it is preferable that water, hydrogen, and the like be not contained in the atmosphere of nitrogen, ultra-dry air, or a rare gas. The purity of nitrogen or a rare gas which is introduced into a heat treatment apparatus is preferably 6N (99.9999%) or higher, more preferably 7N (99.99999%) or higher (that is, the impurity concentration is 1 ppm or lower, preferably 0.1 ppm or lower). Alternatively, the thermal deposition may be performed under reduced pressure or in a vacuum.

By the heat treatment of the metal-element-containing film 424, the metal element(s) contained in the metal-element-containing film 424 is introduced into the oxide semiconductor films 403 and 413. Thus, the channel formation region 409 is formed in a region of the oxide semiconductor film 403, which overlaps with the gate electrode layer 401, and the source region 404a and the drain region 404b are formed in regions between which the channel formation region 409 is interposed in the channel length direction. The source region 404a and the drain region 404b contain the metal element(s) and have a lower resistance than the channel formation region 409. Similarly, the channel formation region 419, and the source region 414a and the drain region 414b which contain the metal element(s) and have a lower resistance than the channel formation region 419 are formed in the oxide semiconductor film 413.

The source region 404a and the drain region 404b having a lower resistance than the channel formation region 409 are formed entirely in the thickness direction of the oxide semiconductor film 403 in FIG. 9B, but are not always formed in that manner. The source region 404a and the drain region 404b might be formed in part of the oxide semiconductor film 403, i.e., near the surfaces thereof. The same applies to the source region 414a and the drain region 414b formed in the oxide semiconductor film 413.

Before and after the heat treatment, with the use of the gate insulating films 402 and 412 and the gate electrode layers 401 and 411 as masks, the dopant 421 may be selectively introduced into the oxide semiconductor films 403 and 413 through the metal-element-containing film 424, as illustrated in FIG. 8D. The description for FIG. 8D can be referred to for the details of the introduction of the dopant 421.

The following steps are performed in a manner similar to that in FIGS. 8E and 8F. The metal-element-containing film 424 is removed by wet etching (see FIG. 9C), and the insulating films 425 and 426 are formed to cover the transistors 440 and 450. Then, the source electrode layer 405a is formed to be in contact with the source region 404a and the gate electrode layer 401, the drain electrode layer 405b is formed to be in contact with the drain region 404b, the source electrode layer 415a is formed to be in contact with the source region 414a, the drain electrode layer 415b is formed to be in contact with the drain region 414b, and the wiring layer 415c is formed to be in contact with the gate electrode layer 411 (see FIG. 9D). The description for FIGS. 8E and 8F can be referred to for the details.

In the above manner, the oxide semiconductor film 403 in the transistor 440 can contain the metal element(s) and the dopant 421, so that the source region 404a and the drain region 404b which have a lower resistance than the channel formation region 409 can be formed. Thus, the transistor 440 can achieve favorable on-state characteristics (e.g., large on-state current and high field-effect mobility), high-speed operation, and high-speed response. Further, an electric field applied to the channel formation region 409 between the source region 404a and the drain region 404b can be relaxed. Furthermore, by electrically connecting the oxide semiconductor film 403 to the source electrode layer 405a and the drain electrode layer 405b in the source region 404a and the drain region 404b, contact resistance between the oxide semiconductor film 403 and the source electrode layer 405a and between the oxide semiconductor film 403 and the drain electrode layer 405b can be lowered. By using the transistor 440 having such characteristics as the transistor 114 in the first protection circuit 104 or the transistor 115 in the second protection circuit 105, it is possible to reduce the possibility of damage of the transistor 114 and the transistor 115, even when the transistor 114 or the transistor 115 serves as a discharge path of surge current of the transistor 111.

Further, the oxide semiconductor film 413 in the transistor 450 can contain the metal element(s) and the dopant 421, so that the source region 414a and the drain region 414b which have a lower resistance than the channel formation region 419 can be formed. Thus, the transistor 450 can achieve favorable on-state characteristics (e.g., large on-state current and high field-effect mobility), high-speed operation, and high-speed response. Further, an electric field applied to the channel formation region 419 between the source region 414a and the drain region 414b can be relaxed. Furthermore, by electrically connecting the oxide semiconductor film 413 to the source electrode layer 415a and the drain electrode layer 415b in the source region 414a and the drain region 414b, contact resistance between the oxide semiconductor film 413 and the source electrode layer 415a and between the oxide semiconductor film 413 and the drain electrode layer 415b can be lowered.

In the oxide semiconductor films 403 and 413 which are highly purified and whose oxygen defects are filled, impurities such as hydrogen and water are sufficiently removed; the hydrogen concentration in the oxide semiconductor film 403 and 413 is less than or equal to $5\times10^{19}/cm^3$, preferably less than or equal to $5\times10^{18}/cm^3$. Note that the concentration of hydrogen in the oxide semiconductor films 403 and 413 is measured by secondary ion mass spectrometry (SIMS).

The number of carriers in the oxide semiconductor films 403 and 413 is extremely small (close to zero), and the carrier concentration is less than $1\times10^{14}/cm^3$, preferably less than $1\times10^{12}/cm^3$, more preferably less than $1\times10^{11}/cm^3$.

The current value in the off state (off-state current value) of the transistors 440 and 450 which are formed according to this embodiment and include the highly purified oxide semiconductor films 403 and 413 containing much oxygen with which oxygen defects are filled is less than or equal to 100 zA per micrometer of channel width at room temperature (1 zA (zeptoampere)=$1\times10^{-21}$ A), preferably less than or equal to 10 zA/μm, more preferably less than or equal to 1 zA/μm, even more preferably less than or equal to 100 yA/μm.

With the use of the transistor 440 having such characteristics as the transistor 114 in the first protection circuit 104, leakage current in the first protection circuit 104 can be reduced. Further, with the use of the transistor 440 having such characteristics as the transistor 115 in the second protection circuit 105, leakage current in the second protection circuit 105 can be reduced. Furthermore, with the use of the transistors 440 and 450 having such excellent electric characteristics, a driver circuit with high performance and high reliability can be provided.

The above structure makes it possible to provide a driver circuit which suppresses damage of a semiconductor element due to ESD in a manufacturing process, and a method of manufacturing the driver circuit. It is also possible to provide a driver circuit provided with a protection circuit with low leakage current, and a method of manufacturing the driver circuit.

The structures, the methods, and the like in this embodiment can be combined with any of structures, methods, and the like in the other embodiments as appropriate.

(Embodiment 3)

Figure 10A:
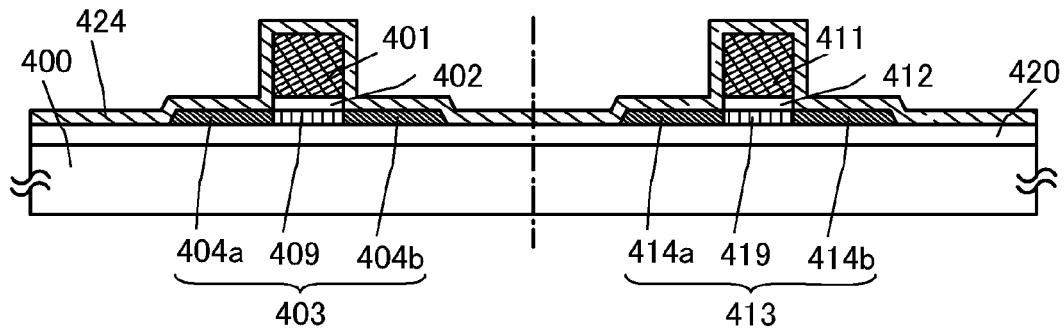
FIGS. 10A to 10C are cross-sectional views illustrating a method of manufacturing a protection circuit used in a driver circuit.
Figure 10B:
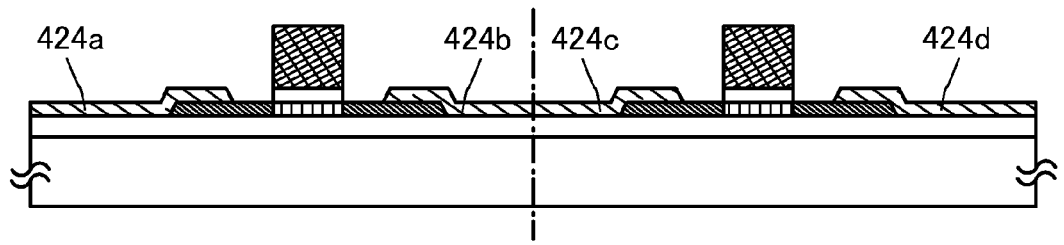
Figure 10C:
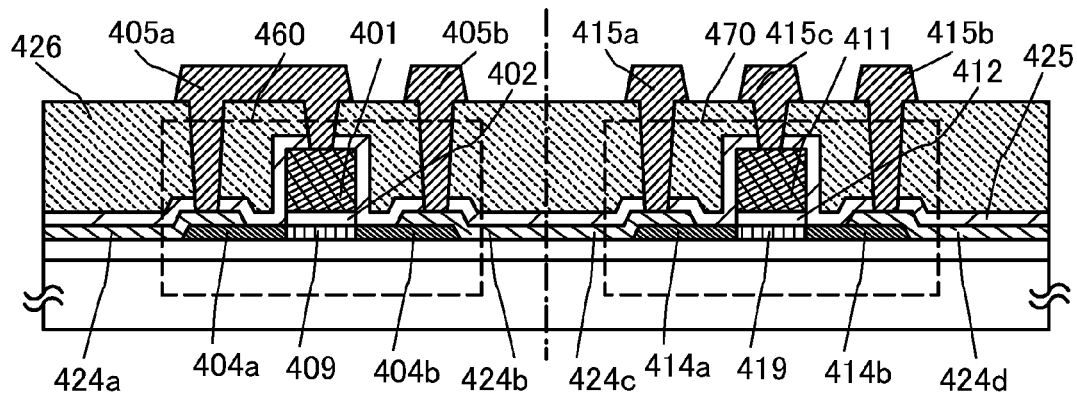

In this embodiment, a method of manufacturing a driver circuit including transistors the structures of which are different from those of the transistors in Embodiment 2 will be described with reference to FIGS. 10A to 10C. As an example, a method of forming a transistor 460 and a transistor 470 at the same time in FIGS. 10A to 10C is described. Here, the transistor 460 corresponds to the transistor 440 in Embodiment 2, i.e., the transistor 114 included in the first protection circuit 104, whereas the transistor 470 corresponds to the transistor 450 in Embodiment 2, i.e., the transistor 111 serving as the semiconductor element 101. Although not shown directly in this embodiment either, the transistor 115 included in the second protection circuit 105 in the above embodiments can be manufactured in a manner similar to that for the transistor 460. In the case where a display portion is provided over the same substrate as the driver circuit portion as in FIGS. 3A and 3B, transistors in the display portion can also be manufactured in a similar manner.

As illustrated in FIG. 10C, the transistor 460 includes, over the substrate 400 which is provided with the insulating film 420 and has an insulating surface, the oxide semiconductor film 403 including the channel formation region 409, the source region 404a, and the drain region 404b, an electrode layer 424a, an electrode layer 424b, the source electrode layer 405a, the drain electrode layer 405b, the gate insulating film 402, and the gate electrode layer 401. Further, the transistor 470 includes, over the substrate 400 which is provided with the insulating film 420 and has an insulating surface, the oxide semiconductor film 413 including the channel formation region 419, the source region 414a, and the drain region 414b, an electrode layer 424c, an electrode layer 424d, the source electrode layer 415a, the drain electrode layer 415b, the wiring layer 415c, the gate insulating film 412, and the gate electrode layer 411.

That is, the transistor 460 is different from the transistor 440 in that the source region 404a and the source electrode layer 405a are connected to each other via the electrode layer 424a, and that the drain region 404b and the drain electrode layer 405b are connected to each other via the electrode layer 424b. Further, the transistor 470 is different from the transistor 450 in that the source region 414a and the source electrode layer 415a are connected to each other via the electrode layer 424c, and that the drain region 414b and the drain electrode layer 415b are connected to each other via the electrode layer 424d.

In the following, steps of manufacturing the transistors 460 and 470 will be described with reference to FIGS. 10A to 10C.

First, as in the state illustrated in FIG. 8D or FIG. 9B, over the substrate 400, the insulating film 420, the oxide semiconductor film 403 (including the source region 404a, the drain region 404b, and the channel formation region 409), the oxide semiconductor film 413 (including the source region 414a, the drain region 414b, and the channel formation region 419), the gate insulating films 402 and 412, the gate electrode layers 401 and 411, and the metal-element-containing film 424 are formed (see FIG. 10A). Embodiment 2 can be referred to for the details.

Next, a resist mask is formed over the metal-element-containing film 424 through a photolithography step, and part of the metal-element-containing film 424 is selectively removed by wet etching. Thus, the electrode layer 424a is formed to be in contact with the source region 404a, the electrode layer 424b is formed to be in contact with the drain region 404b, the electrode layer 424c is formed to be in contact with the source region 414a, and the electrode layer 424d is formed to be in contact with the drain region 414b (see FIG. 10B). The description for FIG. 8E can be referred to for the details of the wet etching.

Here, the electrode layers 424a and 424b are formed so as not to be in contact with the gate electrode layer 401 nor the gate insulating film 402, and the electrode layers 424c and 424d are formed so as not to be in contact with the gate electrode layer 411 nor the gate insulating film 412.

Next, the insulating films 425 and 426 are formed to cover the transistors 460 and 470 (see FIG. 10C). The description in Embodiment 2 can be referred to for the details of the insulating films 425 and 426.

After the formation of the electrode layers 424a, 424b, 424c, and 424d, for example, after the formation of the insulating film 425, the dopant 421 may be selectively introduced to the oxide semiconductor films 403 and 413 through the metal-element-containing film 424 with the use of the gate insulating films 402 and 412, the gate electrode layers 401 and 411, and the electrode layers 424a, 424b, 424c, and 424d as masks, in a manner similar to that in FIG. 8D. The description for FIG. 8D can be referred to for the details of the introduction of the dopant 421. Thus, a region of the source region 404a, which does not overlap with the electrode layer 424a, a region of the drain region 404b, which does not overlap with the electrode layer 424b, a region of the source region 414a, which does not overlap with the electrode layer 424c, and a region of the drain region 414b, which does not overlap with the electrode layer 424d can have a lower resistance, whereby on-state characteristics of the transistors 460 and 470 (e.g., on-state current and field-effect mobility) can be improved.

Lastly, openings reaching the gate electrode layers 401 and 411 and the electrode layers 424a, 424b, 424c, and 424d are formed in the insulating films 425 and 426. Over the insulating films 425 and 426 and through the openings, the source electrode layer 405a is formed to be in contact with the electrode layer 424a and the gate electrode layer 401, the drain electrode layer 405b is formed to be in contact with the electrode layer 424b, the source electrode layer 415a is formed to be in contact with the electrode layer 424c, the drain electrode layer 415b is formed to be in contact with the electrode layer 424d, and the wiring layer 415c is formed to be in contact with the gate electrode layer 411 (see FIG. 10C). Here, Embodiment 2 can be referred to for the conductive film for forming the source electrode layers 405a and 415a, the drain electrode layers 405b and 415b, and the wiring layer 415c, methods of forming the conductive film, and methods of etching the conductive film.

In the above manner, the transistor 460 including the oxide semiconductor film 403 including the channel formation region 409, the source region 404a, and the drain region 404b, the electrode layers 424a and 424b, the source electrode layer 405a, the drain electrode layer 405b, the gate insulating film 402, and the gate electrode layer 401, and the transistor 470 including the oxide semiconductor film 413 including the channel formation region 419, the source region 414a, and the drain region 414b, the electrode layers 424c and 424d, the source electrode layer 415a, the drain electrode layer 415b, the wiring layer 415c, the gate insulating film 412, and the gate electrode layer 411 can be formed at the same time.

In the above manner, the source region 404a and the source electrode layer 405a are connected to each other via the electrode layer 424a, the drain region 404b and the drain electrode layer 405b are connected to each other via the electrode layer 424b, the source region 414a and the source electrode layer 415a are connected to each other via the electrode layer 424c, and the drain region 414b and the drain electrode layer 415b are connected to each other via the electrode layer 424d; therefore, the contact resistance at each contact portion can be reduced.

Even when a high surge voltage such as ESD is applied to the transistor 111 (transistor 470) in the formation of the source electrode layers 405a and 415a, the drain electrode layers 405b and 415b, and the wiring layer 415c, as described in the above embodiments, the first protection circuit 104 including the transistor 114 (transistor 460) or the second protection circuit 105 including the transistor 115 (transistor 460) serves as a discharge path, thereby preventing surge current from flowing into the transistor 111. At this time, the contact resistance at the contact portion is reduced by connecting the source region 404a and the source electrode layer 405a to each other via the electrode layer 424a and by connecting the drain region 404b and the drain electrode layer 405b to each other via the electrode layer 424b, resulting in a reduction in the possibility of damage of the transistors 114 and 115 even when the transistor 114 or the transistor 115 serves as a discharge path of surge current of the transistor 111.

With the use of the transistor 460 having such characteristics as the transistor 114 in the first protection circuit 104, leakage current in the first protection circuit 104 can be reduced. Further, with the use of the transistor 460 having such characteristics as the transistor 115 in the second protection circuit 105, leakage current in the second protection circuit 105 can be reduced. Furthermore, with the use of the transistors 460 and 470 having such excellent electric characteristics, a driver circuit with high performance and high reliability can be provided.

A method of manufacturing a driver circuit including a transistor 480 and a transistor 490 which are different from the transistors 460 and 470 in FIGS. 10A to 10C will be described with reference to FIGS. 11A to 11E. Here, the transistor 480 corresponds to the transistor 440 in Embodiment 2, i.e., the transistor 114 included in the first protection circuit 104, whereas the transistor 490 corresponds to the transistor 450 in Embodiment 2, i.e., the transistor 111 serving as the semiconductor element 101. Although not shown directly in this embodiment either, the transistor 115 included in the second protection circuit 105 in the above embodiments can be manufactured in a manner similar to that for the transistor 480. In the case where a display portion is provided over the same substrate as the driver circuit portion as in FIGS. 3A and 3B, transistors in the display portion can also be manufactured in a similar manner.

Figure 11A:
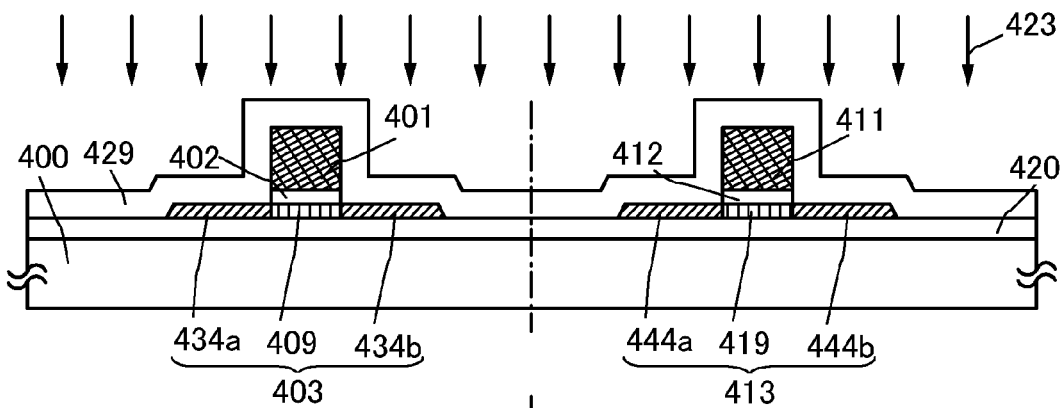
FIGS. 11A to 11E are cross-sectional views illustrating a method of manufacturing a protection circuit used in a driver circuit.
Figure 11B:
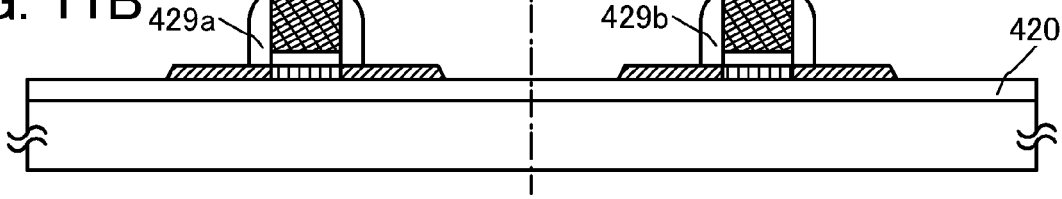
Figure 11C:
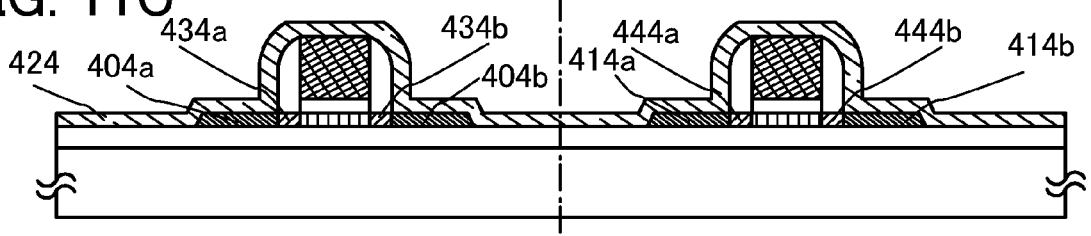
Figure 11D:
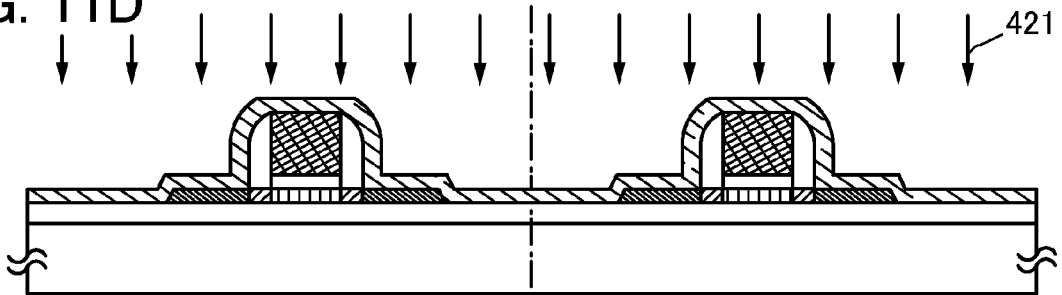
Figure 11E:
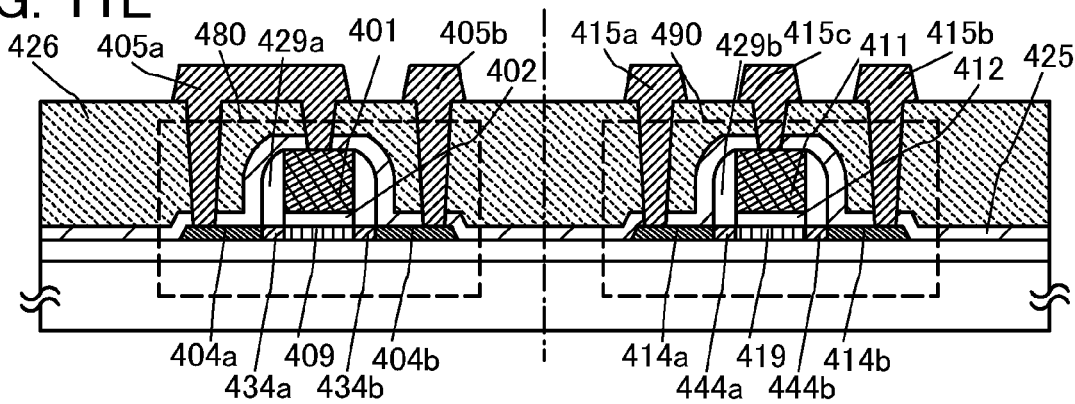

As illustrated in FIG. 11E, the transistor 480 includes, over the substrate 400 which is provided with the insulating film 420 and has the insulating surface, the oxide semiconductor film 403 including the channel formation region 409, the source region 404a, the drain region 404b, a low-concentration impurity region 434a, and a low-concentration impurity region 434b, the source electrode layer 405a, the drain electrode layer 405b, the gate insulating film 402, the gate electrode layer 401, and a sidewall insulating film 429a. Further, the transistor 490 includes, over the substrate 400 which is provided with the insulating film 420 and has the insulating surface, the oxide semiconductor film 413 including the channel formation region 419, the source region 414a, the drain region 414b, a low-concentration impurity region 444a, and a low-concentration impurity region 444b, the source electrode layer 415a, the drain electrode layer 415b, the wiring layer 415c, the gate insulating film 412, the gate electrode layer 411, and a sidewall insulating film 429b.

That is, the transistor 480 is different from the transistor 440 in that the sidewall insulating film 429a is provided at a side surface of the gate electrode layer 401, and that, in a region of the oxide semiconductor film 403, which overlaps with the sidewall insulating film 429a, the low-concentration impurity region 434a is provided between the source region 404a and the channel formation region 409, and the low-concentration impurity region 434b is provided between the drain region 404b and the channel formation region 409. Further, the transistor 490 is different from the transistor 450 in that the sidewall insulating film 429b is provided at a side surface of the gate electrode layer 411, and that, in a region of the oxide semiconductor film 413, which overlaps with the sidewall insulating film 429b, the low-concentration impurity region 444a is provided between the source region 414a and the channel formation region 419, and the low-concentration impurity region 444b is provided between the drain region 414b and the channel formation region 419.

In the following, shows steps of manufacturing the transistors 480 and 490 will be described with reference to FIGS. 11A to 11E.

First, as in the state in FIG. 8B, over the substrate 400, the insulating film 420, the oxide semiconductor films 403 and 413, the gate insulating films 402 and 412, and the gate electrode layers 401 and 411 are formed. Embodiment 2 can be referred to for the details.

Next, an insulating film 429 is formed to cover the oxide semiconductor films 403 and 413, the gate insulating films 402 and 412, and the gate electrode layers 401 and 411, and a dopant 423 is selectively introduced into the oxide semiconductor films 403 and 413 through the insulating film 429 with the use of the gate insulating films 402 and 412 and the gate electrode layers 401 and 411 as masks (see FIG. 11A). Thus, the channel formation region 409 is formed in a region of the oxide semiconductor film 403, which overlaps with the gate electrode layer 401, and the low-concentration impurity regions 434a and 434b are formed in regions between which the channel formation region 409 is interposed in a channel length direction. The low-concentration impurity regions 434a and 434b have a lower resistance than the channel formation region 409. Similarly, the channel formation region 419, and the low-concentration regions 444a and 444b having a lower resistance than the channel formation region 419 are formed in the oxide semiconductor film 413.

There is no particular limitation on the insulating film 429; for example, a silicon oxide film with favorable step coverage, which is formed by reacting TEOS (tetraethyl orthosilicate), silane, or the like with oxygen, nitrous oxide, or the like can be used. The insulating film 429 can be formed by a thermal CVD method, a plasma CVD method, an atmospheric pressure CVD method, a bias ECRCVD method, a sputtering method, or the like. The insulating film may be formed using silicon oxide formed by a low temperature oxidation (LTO) method.

The dopant 423 can be introduced in a manner similar to that for the introduction of the dopant 421 in FIG. 8D. Note that the dosage of the dopant 423 is preferably smaller than that of the dopant 421 which is introduced in a later step so that the low-concentration impurity regions 434a, 434b, 444a, and 444b can have lower impurity concentration than the source regions 404a and 414a and the drain regions 404b and 414b which are formed in a later step.

Then, anisotropic etching is performed on the insulating film 429, so that the sidewall insulating film 429a and the sidewall insulating film 429b are formed to be in contact with the side surface of the gate electrode layer 401 and with the side surface of the gate electrode layer 411, respectively, in a self-aligned manner (see FIG. 11B). Here, the etching of the insulating film 429 can be performed by, for example, a reactive ion etching (RIE) method.

Then, as in FIG. 8C, the metal-element-containing film 424 is formed over the oxide semiconductor films 403 and 413, the gate insulating films 402 and 412, and the gate electrode layers 401 and 411 to be in contact with part of the oxide semiconductor films 403 and 413 while the substrate 400 is heated (see FIG. 11C). Thus, the metal element(s) contained in the metal-element-containing film 424 is introduced into the oxide semiconductor films 403 and 413.

Thus, the source region 404a is formed in a region of the low-concentration impurity region 434a, which does not overlap with the sidewall insulating film 429a, and the drain region 404b is formed in a region of the low-concentration impurity region 434b, which does not overlap with the sidewall insulating film 429a. Further, the source region 414a is formed in a region of the low-concentration impurity region 444a, which does not overlap with the sidewall insulating film 429b, and the drain region 414b is formed in a region of the low-concentration impurity region 444b, which does not overlap with the sidewall insulating film 429b. Here, the source regions 404a and 414a and the drain regions 404b and 414b have lower resistance than the low-concentration impurity regions 434a, 434b, 444a, and 444b.

Here, the metal-element-containing film 424 can be formed in a manner similar to that in FIG. 8D. Further, as illustrated in FIGS. 9A and 9B, after the formation of the metal-element-containing film 424, a heat treatment may be performed.

Next, with the use of the gate insulating films 402 and 412, the gate electrode layers 401 and 411, and the sidewall insulating films 429a and 429b as masks, a dopant 421 may be selectively introduced into the oxide semiconductor films 403 and 413 through the metal-element-containing film 424 so that the resistance of the source regions 404a and 414a and the drain regions 404b and 414b can be even lower (see FIG. 11D).

The dopant 421 can be introduced in a manner similar to that for the introduction of the dopant 421 in FIG. 8D.

The following steps are performed in a manner similar to that in FIGS. 8E and 8F. The metal-element-containing film 424 is removed by wet etching, and the insulating films 425 and 426 are formed to cover the transistors 480 and 490. Then, the source electrode layer 405a is formed to be in contact with the source region 404a and the gate electrode layer 401, the drain electrode layer 405b is formed to be in contact with the drain region 404b, the source electrode layer 415a is formed to be in contact with the source region 414a, the drain electrode layer 415b is formed to be in contact with the drain region 414b, and the wiring layer 415c is formed to be in contact with the gate electrode layer 411 (see FIG. 11E). The description for FIGS. 8E and 8F can be referred to for the details.

In the above manner, the transistor 480 including the oxide semiconductor film 403 including the channel formation region 409, the source region 404a, the drain region 404b, and the low-concentration impurity regions 434a and 434b, the source electrode layer 405a, the drain electrode layer 405b, the gate insulating film 402, the gate electrode layer 401, and the sidewall insulating film 429a, and the transistor 490 including the oxide semiconductor film 413 including the channel formation region 419, the source region 414a, the drain region 414b, and the low-concentration impurity regions 444a and 444b, the source electrode layer 415a, the drain electrode layer 415b, the wiring layer 415c, the gate insulating film 412, the gate electrode layer 411, and the sidewall insulating film 429b can be formed at the same time.

By providing the low-concentration impurity regions 434a and 434b such that the channel formation region 409 is interposed therebetween, and by further providing the source region 404a and the drain region 404b such that the above components are interposed therebetween in the oxide semiconductor film 403 in the transistor 480, an electric field applied to the channel formation region can be relaxed, and a short-channel effect can be suppressed. Note that the same applies to the transistor 490.

Even when a high surge voltage such as ESD is applied to the transistor 111 (transistor 490) in the formation of the source electrode layers 405a and 415a, the drain electrode layers 405b and 415b, and the wiring layer 415c, as described in the above embodiments, the first protection circuit 104 including the transistor 114 (transistors 480) or the second protection circuit 105 including the transistor 115 (transistors 480) serves as a discharge path, thereby preventing surge current from flowing into the transistor 111.

With the use of the transistor 480 having such characteristics as the transistor 114 in the first protection circuit 104, leakage current in the first protection circuit 104 can be reduced. Further, with the use of the transistor 480 having such characteristics as the transistor 115 in the second protection circuit 105, leakage current in the second protection circuit 105 can be reduced. Furthermore, with the use of the transistors 480 and 490 having such excellent electric characteristics, a driver circuit with high performance and high reliability can be provided.

Further, a method of manufacturing a driver circuit including a transistor 481 and a transistor 491, which are different from the transistors 480 and 490 in FIGS. 11A to 11E will be described with reference to FIGS. 15A to 15E. Here, the transistor 481 corresponds to the transistor 440 in Embodiment 2, i.e., the transistor 114 included in the first protection circuit 104, and the transistor 491 corresponds to the transistor 450 in Embodiment 2, i.e., the transistor 111 serving as the semiconductor element 101.

Figure 15A:
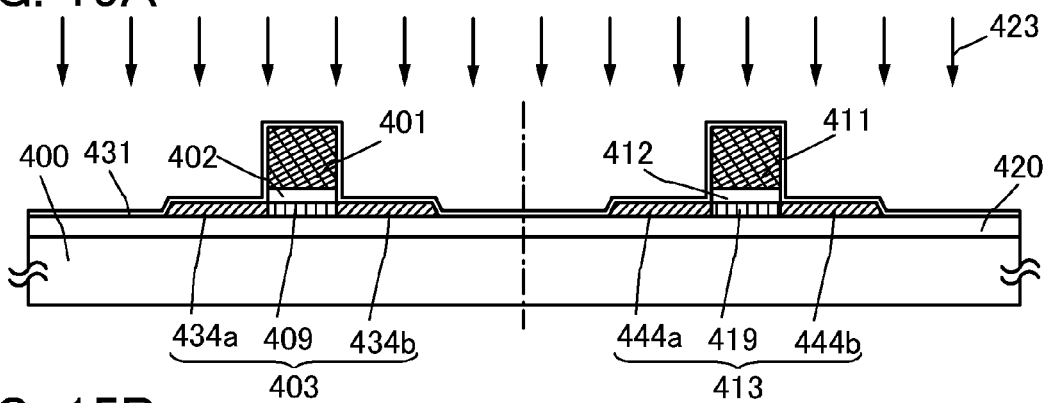
FIGS. 15A to 15E are cross-sectional views illustrating a method of manufacturing a protection circuit used in a driver circuit.
Figure 15B:
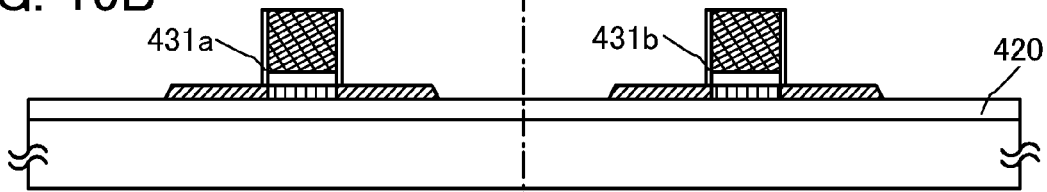
Figure 15C:
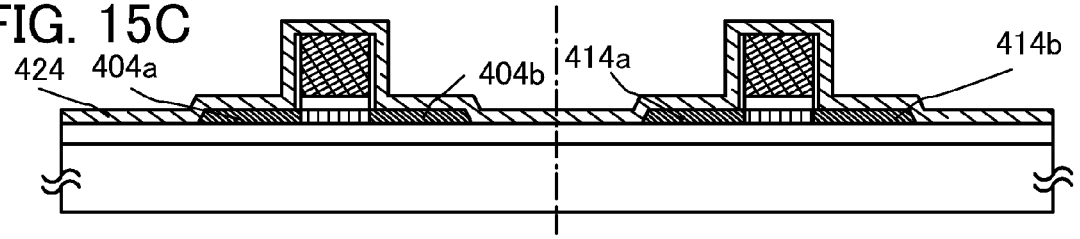
Figure 15D:
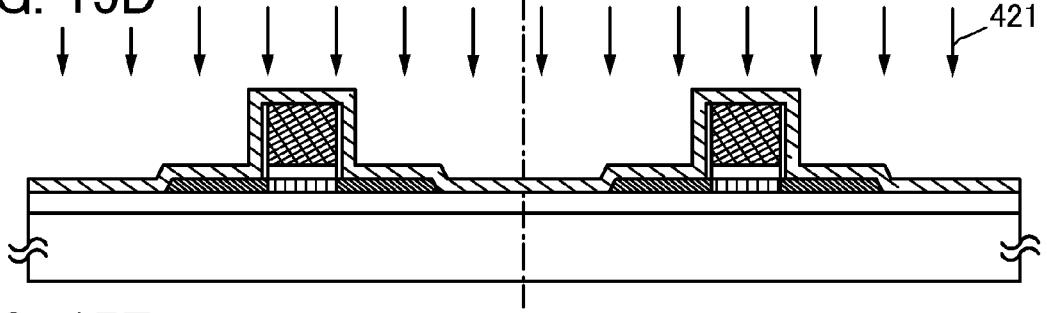
Figure 15E:
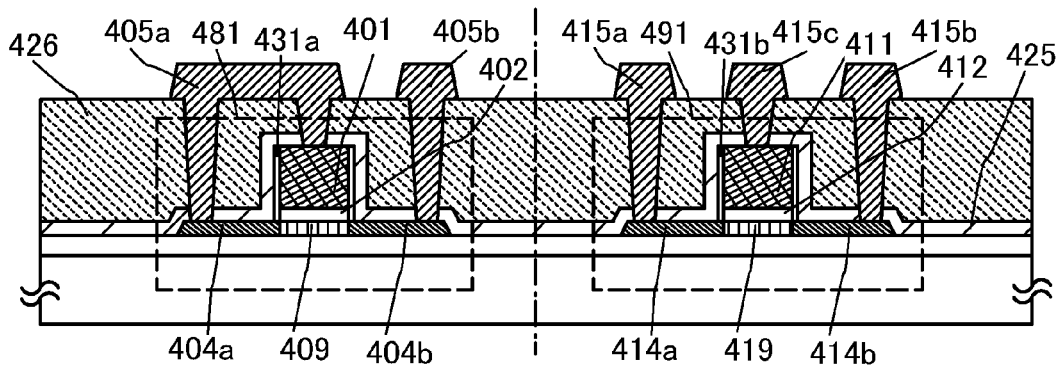

As illustrated in FIG. 15E, the transistor 481 includes, over the substrate 400 which is provided with the insulating film 420 and has the insulating surface, the oxide semiconductor film 403 including the channel formation region 409, the source region 404a, and the drain region 404b, the source electrode layer 405a, the drain electrode layer 405b, the gate insulating film 402, the gate electrode layer 401, and a sidewall insulating film 431a. Further, the transistor 491 includes, over the substrate 400 which is provided with the insulating film 420 and has the insulating surface, the oxide semiconductor film 413 including the channel formation region 419, the source region 414a, and the drain region 414b, the source electrode layer 415a, the drain electrode layer 415b, the wiring layer 415c, the gate insulating film 412, the gate electrode layer 411, and a sidewall insulating film 431b.

That is, the transistor 481 is different from the transistor 480 in that the sidewall insulating film 431a with a small thickness of about 1 nm to 10 nm is formed and that substantially no the low-concentration impurity region is formed. Further, the transistor 491 is different from the transistor 490 in that the sidewall insulating film 431b with a small thickness of about 1 nm to 10 nm is formed and that substantially no the low-concentration impurity region is formed.

In the following, steps of manufacturing the transistors 481 and 491 will be described with reference to FIGS. 15A to 15E.

First, as in the state in FIG. 8B, over the substrate 400, the insulating film 420, the oxide semiconductor films 403 and 413, the gate insulating films 402 and 412, and the gate electrode layers 401 and 411 are formed. Embodiment 2 can be referred to for the details.

Next, an insulating film 431 with a large thickness is formed to cover the oxide semiconductor films 403 and 413, the gate insulating films 402 and 412, and the gate electrode layers 401 and 411, and the dopant 423 is selectively introduced into the oxide semiconductor films 403 and 413 through the insulating film 431 with the use of the gate insulating films 402 and 412 and the gate electrode layers 401 and 411 as masks (see FIG. 15A). Thus, the channel formation region 409 is formed in a region of the oxide semiconductor film 403, which overlaps with the gate electrode layer 401, and the low-concentration impurity regions 434a and 434b are formed in regions between which the channel formation region 409 is interposed in a channel length direction. The low-concentration impurity regions 434a and 434b have a lower resistance than the channel formation region 409. Similarly, the channel formation region 419, and the low-concentration regions 444a and 444b having a lower resistance than the channel formation region 419 are formed in the oxide semiconductor film 413.

Here, the thickness of the insulating film 431 is preferably 1 nm to 10 nm, more preferably 3 nm to 5 nm. The insulating film 431 can be formed using a material and a method similar to those of the insulating film 429 in FIG. 11A. The dopant 423 can be introduced in a manner similar to that for the introduction of the dopant 423 in FIG. 11A.

Then, anisotropic etching is performed on the insulating film 431, so that the sidewall insulating film 431a and the sidewall insulating film 431b are formed to be in contact with the side surface of the gate electrode layer 401 and with the side surface of the gate electrode layer 411, respectively, in a self-aligned manner (see FIG. 15B).

By providing the sidewall insulating film 431a with a small thickness in this manner, the gate and any one of the source and the drain of the transistor 481 can be prevented from being short-circuited. Further, by providing the sidewall insulating film 431b with a small thickness, the gate and any one of the source and the drain of the transistor 491 can be prevented from being short-circuited.

Here, the insulating film 431 can be etched in a manner similar to that for the etching of the insulating film 429 in FIG. 11B.

Then, as in FIG. 8C, the metal-element-containing film 424 is formed over the oxide semiconductor films 403 and 413, the gate insulating films 402 and 412, and the gate electrode layers 401 and 411 to be in contact with part of the oxide semiconductor films 403 and 413 while the substrate 400 is heated (see FIG. 15C). Thus, the metal element(s) contained in the metal-element-containing film 424 is introduced into the oxide semiconductor films 403 and 413.

Thus, the metal element(s) is introduced into the low-concentration impurity regions 434a, 434b, 444a, and 444b, so that the resistance is further lowered. Here, in the step in FIG. 11C, the metal element(s) is not introduced into a portion of the oxide semiconductor film, which overlaps with the sidewall insulating film, and the low-concentration impurity region is maintained in the portion; however, in the step in FIG. 15C, the metal element(s) is introduced entirely into the low-concentration regions 434a, 434b, 444a, and 444b because the thickness of the sidewall insulating films 431a and 431b is sufficiently small. Therefore, the low-concentration impurity region 434a, the low-concentration impurity region 434b, the low-concentration impurity region 444a, and the low-concentration impurity region 444b serve as the source region 404a, the drain region 404b, the source region 414a, and the drain region 414b, respectively, so that the transistors 481 and 491 have a single drain structure.

Here, the metal-element-containing film 424 can be formed in a manner similar to that in FIG. 8D. Further, as illustrated in FIGS. 9A and 9B, after the formation of the metal-element-containing film 424, a heat treatment may be performed.

Next, with the use of the gate insulating films 402 and 412 and the gate electrode layers 401 and 411 as masks, the dopant 421 may be selectively introduced into the oxide semiconductor films 403 and 413 through the metal-element-containing film 424 so that the resistance of the source regions 404a and 414a and the drain regions 404b and 414b can be even lower (see FIG. 15D). Needless to say, the dopant 421 is also introduced entirely into the source regions 404a and 414b and the drain regions 404b and 414b, so that the transistors 481 and 491 have a single drain structure.

The dopant 421 can be introduced in a manner similar to that for the introduction of the dopant 421 in FIG. 11D.

The following steps are performed in a manner similar to that in FIGS. 8E and 8F. The metal-element-containing film 424 is removed by wet etching, and the insulating films 425 and 426 are formed to cover the transistors 481 and 491. Then, the source electrode layer 405a is formed to be in contact with the source region 404a and the gate electrode layer 401, the drain electrode layer 405b is formed to be in contact with the drain region 404b, the source electrode layer 415a is formed to be in contact with the source region 414a, the drain electrode layer 415b is formed to be in contact with the drain region 414b, and the wiring layer 415c is formed to be in contact with the gate electrode layer 411 (FIG. 15E). The description for FIGS. 8E and 8F can be referred to for the details.

In the above manner, the transistor 481 including the oxide semiconductor film 403 including the channel formation region 409, the source region 404a, and the drain region 404b, the source electrode layer 405a, the drain electrode layer 405b, the gate insulating film 402, the gate electrode layer 401, and the sidewall insulating film 431a, and the transistor 491 including the oxide semiconductor film 413 including the channel formation region 419, the source region 414a, and the drain region 414b, the source electrode layer 415a, the drain electrode layer 415b, the wiring layer 415c, the gate insulating film 412, the gate electrode layer 411, and the sidewall insulating film 431b can be formed at the same time.

Figure 16:
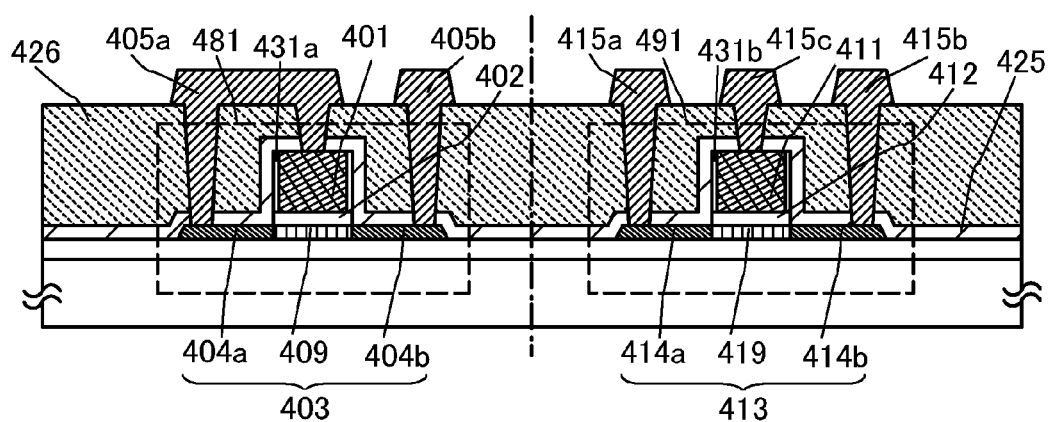
FIG. 16 is a cross-sectional view illustrating a protection circuit used in a driver circuit.

In the steps of manufacturing the transistors 481 and 491 in FIGS. 15A to 15E, the sidewall insulating films 431a and 431b are formed after the gate insulating films 402 and 412 are formed. Alternatively, without limitation, the sidewall insulating films 431a and 431b and the gate insulating films 402 and 412 may be formed by being simultaneously etched, or the gate insulating films 402 and 412 may be formed by etching with the use of the sidewall insulating films 431a and 431b formed in advance as masks. In the case where the transistors 481 and 491 are formed in the above manner, as illustrated in FIG. 16, the sidewall insulating film 431a is formed over and in contact with the gate insulating film 402 and the sidewall insulating film 431b is formed over and in contact with the gate insulating film 412.

The above structure makes it possible to provide a driver circuit which suppresses damage of a semiconductor element due to ESD in a manufacturing process, and a method of manufacturing the driver circuit. It is also possible to provide a driver circuit provided with a protection circuit with low leakage current, and a method of manufacturing the driver circuit.

The structures, the methods, and the like in this embodiment can be combined with each other, or can also be combined with any of structures, methods, and the like in the other embodiments as appropriate.

(Embodiment 4)

A semiconductor device having a display function (also referred to as display device) can be manufactured using the transistor described in any of Embodiments 1 to 3, and a driver circuit including the transistor. In the case where part or the whole of the driver circuit including the transistor is integrally formed over the same substrate as a pixel portion to form a system on panel, the transistor in the driver circuit and a transistor in a display portion can be formed at the same time.

Figure 12A:
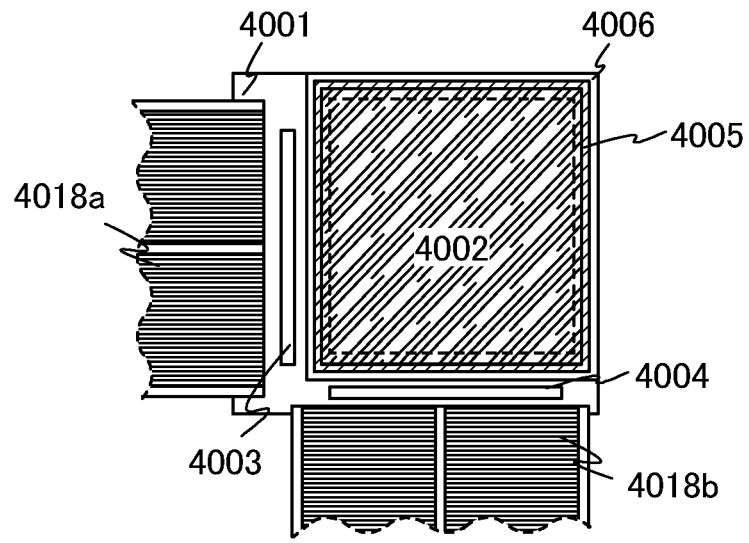
FIGS. 12A to 12C each illustrate a display device including a driver circuit.

In FIG. 12A, a sealant 4005 is provided so as to surround a pixel portion 4002 provided over a first substrate 4001, and the pixel portion 4002 is sealed with a second substrate 4006. In FIG. 12A, a signal line driver circuit 4003 and a scan line driver circuit 4004 which are formed using a single crystal semiconductor film or a polycrystalline semiconductor film over another substrate are mounted in a region that is different from the region surrounded by the sealant 4005 over the first substrate 4001. Various signals and potential are supplied to the signal line driver circuit 4003 and the scan line driver circuit 4004 each of which is separately formed, and to the pixel portion 4002 from flexible printed circuits (FPCs) 4018a and 4018b.

Figure 12B:
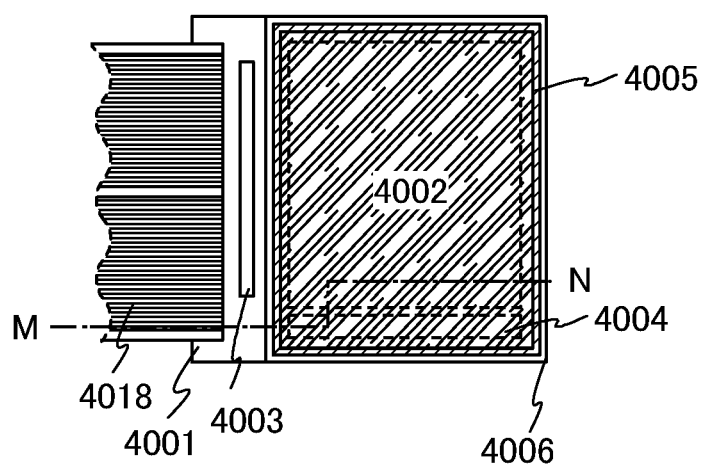
Figure 12C:
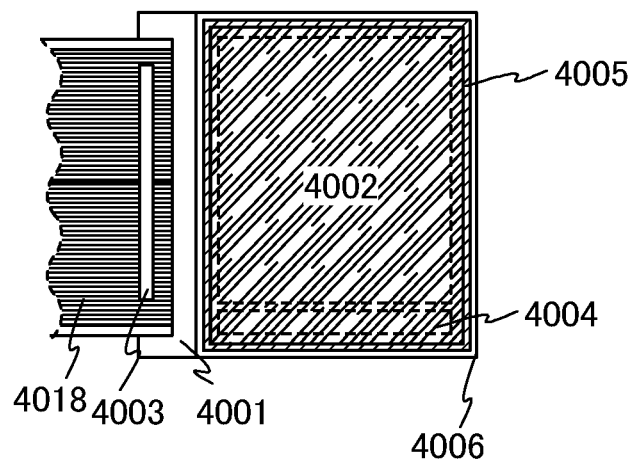

In FIGS. 12B and 12C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with the display element, by the first substrate 4001, the sealing material 4005, and the second substrate 4006. In FIGS. 12B and 12C, the signal line driver circuit 4003 which is formed using a single crystal semiconductor film or a polycrystalline semiconductor film over another substrate is mounted in a region that is different from the region surrounded by the sealant 4005 over the first substrate 4001. In FIGS. 12B and 12C, various signals and potential are supplied to the signal line driver circuit 4003, the scan line driver circuit 4004, and the pixel portion 4002 from an FPC 4018.

Although FIGS. 12B and 12C each illustrate an example in which the signal line driver circuit 4003 is separately formed and mounted on the first substrate 4001, an embodiment of the invention is not limited to this structure. The scan line driver circuit may be formed separately and then mounted, or only part of the signal line driver circuit or part of the scan line driver circuit may be formed separately and then mounted.

Note that there is no particular limitation on a method of connecting a separately formed driver circuit, and a chip on glass (COG) method, a wire bonding method, a tape automated bonding (TAB) method or the like can be used. FIG. 12A illustrates an example in which the signal line driver circuit 4003 and the scan line driver circuit 4004 are mounted by a COG method. FIG. 12B illustrates an example in which the signal line driver circuit 4003 is mounted by a COG method. FIG. 12C illustrates an example in which the signal line driver circuit 4003 is mounted by a TAB method.

In addition, the display device includes a panel in which the display element is sealed, and a module in which an IC or the like including a controller is mounted on the panel.

Note that a display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

Further, the pixel portion provided over the first substrate includes a plurality of transistors, to which the transistor the example of which is described in any of the above embodiments can be applied, as in the driver circuit in the above embodiments.

As the display element provided in the display device, a liquid crystal element (also referred to as liquid crystal display element) or a light-emitting element (also referred to as light-emitting display element) can be used. The light-emitting element includes, in its category, an element the luminance of which is controlled by current or voltage, and specifically includes, in its category, an inorganic electroluminescent (EL) element, an organic EL element, and the like. Furthermore, a display medium the contrast of which is changed by an electric effect, such as electronic ink, can be used.

Embodiments of a display device will be described with reference to FIGS. 12A to 12C and FIGS. 13A and 13B. FIGS. 13A and 13B are each a cross-sectional view taken along line M-N in FIG. 12B.

As illustrated in FIGS. 12A to 12C and FIGS. 13A and 13B, the display device includes a connection terminal electrode 4015 and a terminal electrode 4016. The connection terminal electrode 4015 and the terminal electrode 4016 are electrically connected to a terminal provided for the FPC 4018 via an anisotropic conductive film 4019.

The connection terminal electrode 4015 is formed using the same conductive film as a first electrode layer 4030, and the terminal electrode 4016 is formed using the same conductive film as source and drain electrode layers of transistors 4010 and 4011.

The pixel portion 4002 and the scan line driver circuit 4004 which are provided over the first substrate 4001 include a plurality of transistors. FIGS. 13A and 13B illustrate the transistor 4010 included in the pixel portion 4002 and the transistor 4011 included in the scan line driver circuit 4004 as an example. An insulating film 4020 is provided over the transistors 4010 and 4011 in FIG. 13A, and an insulating film 4021 is further provided in FIG. 13B. Here, the insulating film 4020 and the insulating film 4021 correspond to the insulating film 425 and the insulating film 426, respectively, in FIGS. 8A to 8F, FIGS. 9A to 9D, FIGS. 10A to 10C, and FIGS. 11A to 11E. Note that an insulating film 4023 is an insulating film serving as a base film.

The transistor which serves as a semiconductor element and is described in any of the above embodiments can be applied to the transistors 4010 and 4011. This embodiment shows an example in which a transistor having a structure similar to that of the transistor 450 described in Embodiment 2 is used.

In a manner similar to that in the above embodiment, the transistors 4010 and 4011 can be transistors including an oxide semiconductor film including low-resistance regions between which a channel formation region is interposed in the channel length direction. Accordingly, on-state characteristics (e.g., on-state current and field-effect mobility) of the transistors 4010 and 4011 are increased, which enables high-speed operation and high-speed response of the transistors. Further, the transistor can be miniaturized.

In the driver circuit of the display device according to this embodiment, as described in the above embodiments, the protection circuit which suppresses damage of the semiconductor element due to ESD in a manufacturing process and has small leakage current is provided. Thus, a very highly reliable driver circuit can be provided.

Accordingly, a high-performance, highly reliable display device can be provided as the display device of this embodiment illustrated in FIGS. 12A to 12C and FIGS. 13A and 13B.

The transistor 4010 included in the pixel portion 4002 is electrically connected to a display element to form a display panel. There is no particular limitation on the kind of the display element as long as display can be performed, and various kinds of display elements can be employed.

FIG. 13A illustrates an example of a liquid crystal display device using a liquid crystal element as a display element. In FIG. 13A, a liquid crystal element 4013 which is a display element includes the first electrode layer 4030, a second electrode layer 4031, and a liquid crystal layer 4008. Insulating films 4032 and 4033 serving as orientation films are provided so that the liquid crystal layer 4008 is interposed therebetween. The second electrode layer 4031 is provided on the second substrate 4006 side, and the first electrode layer 4030 and the second electrode layer 4031 are stacked, with the liquid crystal layer 4008 interposed therebetween.

A columnar spacer denoted by reference numeral 4035 is obtained by selective etching of an insulating film and is provided in order to control the thickness (cell gap) of the liquid crystal layer 4008. Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is unnecessary may be used for the liquid crystal layer 4008. A blue phase is one of liquid crystal phases, which is generated just before a cholesteric phase changes into an isotropic phase while temperature of cholesteric liquid crystal is increased. The blue phase can be exhibited using a liquid crystal composition which is a mixture of a liquid crystal and a chiral agent. To increase the temperature range where the blue phase is exhibited, a liquid crystal layer can be formed by adding a polymerizable monomer, a polymerization initiator, and the like to a liquid crystal composition exhibiting a blue phase and by performing a polymer stabilization treatment. The liquid crystal composition exhibiting a blue phase has a short response time, and has optical isotropy, which makes the alignment process unnecessary and the viewing angle dependence small. In addition, since an alignment film does not need to be provided and a rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased. A transistor including an oxide semiconductor film has a possibility that the electric characteristics of the transistor may vary significantly by the influence of static electricity and deviate from the designed range. Thus, it is more effective to use a liquid crystal composition exhibiting a blue phase for a liquid crystal display device including the transistor that includes an oxide semiconductor film.

The specific resistivity of the liquid crystal composition is greater than or equal to $1 \times 10^9$ Ω·cm, preferably greater than or equal to $1 \times 10^{11}$ Ω·cm, more preferably greater than or equal to $1 \times 10^{12}$ Ω·cm. Note that the specific resistivity in this specification is measured at 20° C.

The capacitance of a storage capacitor formed in the liquid crystal display device is set considering leakage current of the transistor provided in the pixel portion or the like so that charge can be held for a predetermined period. The capacitance of the storage capacitor may be set considering the off-state current of a transistor or the like. By using the transistor that is disclosed in this specification and includes the oxide semiconductor film, it is enough to provide a storage capacitor having a capacitance that is ⅓ or less, preferably ⅕ or less of a liquid crystal capacitance of each pixel.

In the transistor that is disclosed in this specification and includes the oxide semiconductor film, the current in an off state (off-state current) can be made small. Accordingly, an electrical signal such as an image signal can be held for a longer period in the pixel, and a writing interval can be set longer in an on state. Accordingly, the frequency of refresh operation can be reduced, which leads to an effect of suppressing power consumption.

The field-effect mobility of the transistor that is disclosed in this specification and includes the oxide semiconductor film can be high, whereby high-speed operation is possible. For example, when such a transistor which can operate at high speed is used for a liquid crystal display device, a switching transistor in a pixel portion and a driver transistor in a driver circuit portion can be formed over one substrate. That is, since a semiconductor device formed of a silicon wafer or the like is not additionally needed as a driver circuit, the number of components of the semiconductor device can be reduced. In addition, by using a transistor which can operate at high speed in a pixel portion, a high-quality image can be provided. Accordingly, reliability as a semiconductor device can be improved.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode. For example, a multi-domain vertical alignment (MVA) mode, a patterned vertical alignment (PVA) mode, an advanced super view (ASV) mode, and the like can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that the disclosed invention is not limited to the application to a display device for color display; the disclosed invention can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as organic EL element, and the latter is referred to as inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as current-excitation light-emitting element.

Inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is interposed between dielectric layers, which are further interposed between electrodes, and its light emission mechanism is localized type light emission that utilizes inner-shell electron transition of metal ions. Note that an example of an organic EL element as a light-emitting element is described here.

In order to extract light emitted from the light-emitting element, it is acceptable as long as at least one of a pair of electrodes has a light-transmitting property. A transistor and a light-emitting element are formed over a substrate. The light-emitting element can have a top emission structure in which light emission is extracted through a surface opposite to the substrate; a bottom emission structure in which light emission is extracted through a surface on the substrate side; or a dual emission structure in which light emission is extracted through the surface opposite to the substrate and the surface on the substrate side, and a light-emitting element having any of these emission structures can be used.

FIG. 13B illustrates an example of a light-emitting device using a light-emitting element as a display element. A light-emitting element 4513 which is a display element is electrically connected to the transistor 4010 provided in the pixel portion 4002. A structure of the light-emitting element 4513 is not limited to the illustrated stacked-layer structure including the first electrode layer 4030, an electroluminescent layer 4511, and the second electrode layer 4031. The structure of the light-emitting element 4513 can be changed as appropriate depending on a direction in which light is extracted from the light-emitting element 4513, or the like.

A partition wall 4510 can be formed using an organic insulating material or an inorganic insulating material. It is particularly preferable that the partition wall 4510 be formed using a photosensitive resin material to have an opening over the first electrode layer 4030 so that a sidewall of the opening is formed as a tilted surface with continuous curvature.

The electroluminescent layer 4511 may be formed using either a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed. In addition, in a space which is formed with the first substrate 4001, the second substrate 4006, and the sealant 4005, a filler 4514 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used as well as an inert gas such as nitrogen or argon. For example, polyvinyl chloride (PVC), an acrylic resin, polyimide, an epoxy resin, a silicone resin, polyvinyl butyral (PVB), or ethylene vinyl acetate (EVA) can be used. Further, nitrogen is preferably used for the filler, for example.

In addition, if needed, an optical film, such as a polarizing plate, a circularly polarizing plate (including an elliptically polarizing plate), a retardation plate (quarter-wave plate or half-wave plate), or a color filter, may be provided as appropriate on a light-emitting surface of the light-emitting element. Further, the polarizing plate or the circularly polarizing plate may be provided with an anti-reflection film. For example, an anti-glare treatment by which reflected light can be diffused by projections and depressions on the surface so as to reduce the glare can be performed.

Further, an electronic paper in which electronic ink is driven can be provided as the display device. The electronic paper is also referred to as electrophoretic display device (electrophoretic display) and is advantageous in that it has the same level of readability as plain paper, it has lower power consumption than other display devices, and it can be made thin and lightweight.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes what is called a dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

In FIGS. 12A to 12C and FIGS. 13A and 13B, as the first substrate 4001 and the second substrate 4006, flexible substrates, for example, plastic substrates having a light-transmitting property or the like can be used, other than glass substrates. As plastic, a fiberglass-reinforced plastics (FRP) plate, a polyvinyl fluoride (PVF) film, a polyester film, or an acrylic resin film can be used. In the case where the light-transmitting property is not requisite, a metal substrate (metal film) of aluminum, stainless steel, or the like may be used. For example, a sheet with a structure in which an aluminum foil is interposed between PVF films or polyester films can be used.

The display device displays an image by transmitting light from a light source or a display element. Therefore, the substrate and the thin films such as the insulating film and the conductive film provided for the pixel portion where light is transmitted have light-transmitting properties with respect to light in the visible-light wavelength range.

The first electrode layer 4030 and the second electrode layer 4031 (each of which may be called pixel electrode layer, common electrode layer, counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (referred to as ITO), indium zinc oxide, indium tin oxide to which silicon oxide is added, or graphene.

The first electrode layer 4030 and the second electrode layer 4031 each can be formed using one kind or plural kinds selected from metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

A conductive composition containing a conductive high molecule (also referred to as conductive polymer) can be used for the first electrode layer 4030 and the second electrode layer 4031. As the conductive high molecule, what is called a π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

By using the transistor described in any of the above embodiments and the driver circuit including the transistor in the above manner, display devices having a variety of functions can be provided.

(Embodiment 5)

A driver circuit disclosed in this specification can be applied to display devices for a variety of electronic appliances (including amusement machines). Examples of electronic appliances are a television set (also referred to as television or television receiver), a monitor of a computer or the like, a camera such as a digital camera or a digital video camera, a digital photo frame, a mobile phone handset (also referred to as mobile phone or mobile phone device), a portable game machine, a portable information terminal, an audio reproducing device, a large-sized game machine such as a pachinko machine, and the like. Examples of electronic devices each including a display device that includes the driver circuit described in the above embodiment will be described.

Figure 14A:
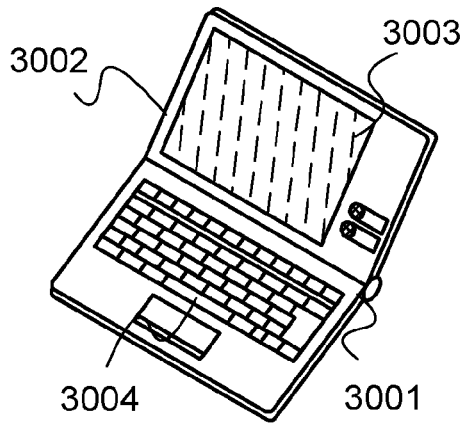
FIGS. 14A to 14F are each an external view of an electronic appliance including a display device in which a driver circuit according to the disclosed invention is used.

FIG. 14A illustrates a laptop personal computer, which includes a main body 3001, a housing 3002, a display portion 3003, a keyboard 3004, and the like. By applying the driver circuit described in any of the above embodiments to the display portion 3003, a laptop personal computer having a high performance and high reliability can be provided.

Figure 14B:
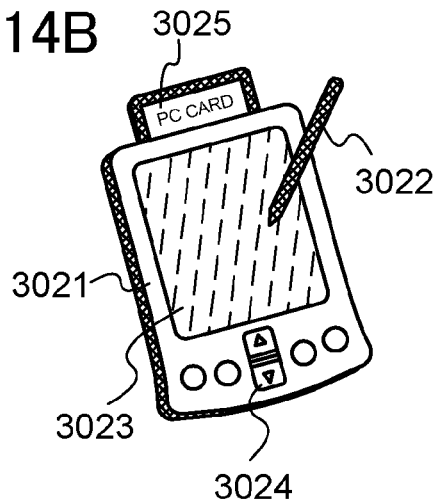

FIG. 14B illustrates a personal digital assistant (PDA), which includes a main body 3021 provided with a display portion 3023, an external interface 3025, operation buttons 3024, and the like. A stylus 3022 is included as an accessory for operation. By applying the driver circuit described in any of the above embodiments to the display portion 3023, a personal digital assistant (PDA) having a high performance and high reliability can be provided.

Figure 14C:
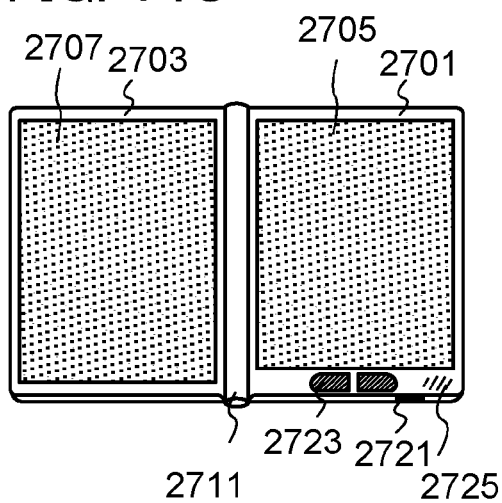

FIG. 14C illustrates an example of an e-book reader. For example, an electronic book reader includes two housings, a housing 2701 and a housing 2703. The housing 2701 and the housing 2703 are combined with a hinge 2711 so that the e-book reader can be opened and closed with the hinge 2711 as an axis. With such a structure, the e-book reader can operate like a paper book.

A display portion 2705 and a display portion 2707 are incorporated in the housing 2701 and the housing 2703, respectively. The display portion 2705 and the display portion 2707 may display one image or different images. In the structure where different images are displayed on different display portions, for example, the right display portion (the display portion 2705 in FIG. 14C) can display text and the left display portion (the display portion 2707 in FIG. 14C) can display images. By applying the driver circuit described in any of the above embodiments to the display portion 2705 and the display portion 2707, an e-book reader having a high performance and high reliability can be provided. In the case of using a transflective or reflective liquid crystal display device as the display portion 2705, the e-book reader may be used in a comparatively bright environment; therefore, a solar cell may be provided so that power generation by the solar cell and charge by a battery can be performed. When a lithium ion battery is used as the battery, there are advantages of downsizing and the like.

FIG. 14C illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (such as an earphone terminal or a USB terminal), a recording medium insertion portion, and the like may be provided on the back surface or the side surface of the housing. Further, the e-book reader may have a function of an electronic dictionary.

The e-book reader may transmit and receive data wirelessly. Through wireless communication, desired book data or the like can be purchased and downloaded from an electronic book server.

Figure 14D:
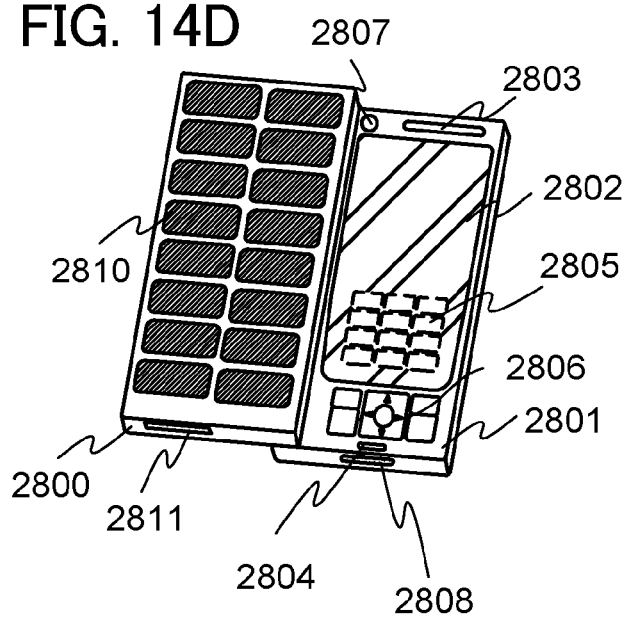

FIG. 14D illustrates a mobile phone, which includes two housings, i.e., a housing 2800 and a housing 2801. The housing 2801 includes a display panel 2802, a speaker 2803, a microphone 2804, a pointing device 2806, a camera lens 2807, an external connection terminal 2808, and the like. The housing 2800 includes a solar cell 2810 for charging the mobile phone, an external memory slot 2811, and the like. Further, an antenna is incorporated in the housing 2801. By applying the driver circuit described in any of the above embodiments to the display panel 2802, a mobile phone having a high performance and high reliability can be provided.

Further, the display panel 2802 is provided with a touch panel. A plurality of operation keys 2805 which is displayed as images is illustrated by dashed lines in FIG. 14D. Note that a boosting circuit by which a voltage output from the solar cell 2810 is increased to be sufficiently high for each circuit is also included.

In the display panel 2802, the display direction can be appropriately changed depending on a usage pattern. Further, the display device is provided with the camera lens 2807 on the same surface as the display panel 2802, and thus it can be used as a video phone. The speaker 2803 and the microphone 2804 can be used for videophone calls, recording and playing sound, and the like as well as voice calls. Moreover, the housings 2800 and 2801 in a state where they are developed as illustrated in FIG. 14D can shift by sliding so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved.

Further, in addition to the above functions, an infrared communication function, a television reception function, or the like may be provided.

Figure 14E:
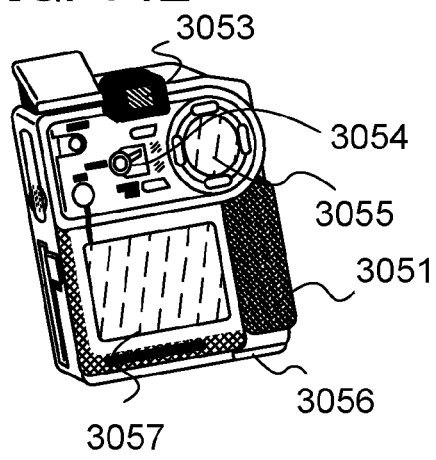

FIG. 14E illustrates a digital video camera which includes a main body 3051, a display portion 3057, an eyepiece portion 3053, an operation switch 3054, a display portion 3055, a battery 3056, and the like. By applying the driver circuit described in any of the above embodiments to the display portions 3057 and 3055, a digital video camera having a high performance and high reliability can be provided.

Figure 14F:
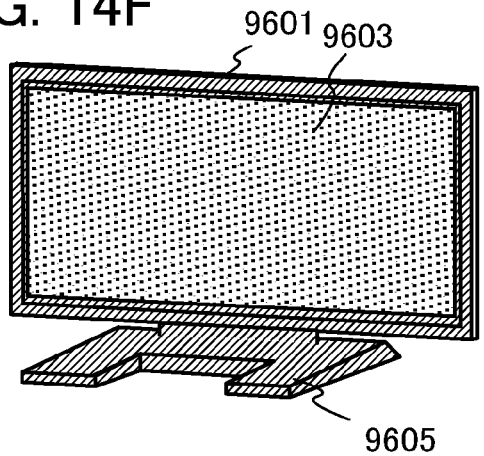

FIG. 14F illustrates an example of a television set. In the television set, a display portion 9603 is incorporated in a housing 9601. The display portion 9603 can display images. Here, the housing 9601 is supported by a stand 9605. By applying the driver circuit described in any of the above embodiments to the display portion 9603, a television set having a high performance and high reliability can be provided.

The television set can operate with an operation switch of the housing 9601 or a separate remote controller. Further, the remote controller may be provided with a display portion for displaying data output from the remote controller.

Note that the television set is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

This embodiment can be combined with any of structures, methods, and the like in the other embodiments as appropriate.

This application is based on Japanese Patent Application serial no. 2011-144836 filed with Japan Patent Office on Jun. 29, 2011, the entire contents of which are hereby incorporated by reference.

What is claimed is:

1. A driver circuit comprising:
a first transistor;
a second transistor;
a third transistor; and
a first protection circuit comprising a fourth transistor,
wherein a first terminal of the first transistor is electrically connected to a first clock signal line,
wherein a second terminal of the first transistor is electrically connected to a gate of the second transistor,
wherein a first terminal of the second transistor is electrically connected to a first power supply line,
wherein a second terminal of the second transistor is electrically connected to a gate of the third transistor,
wherein a first terminal of the third transistor is electrically connected to a second clock signal line,
wherein a first terminal of the fourth transistor is electrically connected to the first power supply line, and
wherein a second terminal of the fourth transistor is electrically connected to the gate of the second transistor and a gate of the fourth transistor.

2. The driver circuit according to claim 1,
wherein the fourth transistor comprises an oxide semiconductor film comprising a channel formation region, a source region and a drain region,
wherein at least one of the source region and the drain region comprises a metal element, and
wherein the metal element is at least one of aluminum and magnesium.

3. The driver circuit according to claim 1, further comprising a fifth transistor,
wherein a first terminal of the fifth transistor is electrically connected to the gate of the second transistor, and
wherein a second terminal of the fifth transistor is electrically connected to a second power supply line.

4. The driver circuit according to claim 3, further comprising a second protection circuit comprising a sixth transistor,
wherein the fourth transistor comprises an oxide semiconductor film comprising a channel formation region,
wherein the sixth transistor comprises an oxide semiconductor film comprising a channel formation region,
wherein a first terminal of the sixth transistor is electrically connected to the gate of the second transistor, and
wherein a second terminal of the sixth transistor is electrically connected to the second power supply line and a gate of the sixth transistor.

5. The driver circuit according to claim 4,
wherein the first protection circuit comprises a seventh transistor,
wherein the first terminal of the fourth transistor is electrically connected to the first power supply line through the seventh transistor,
wherein a first terminal of the seventh transistor is electrically connected to the first power supply line, and
wherein a second terminal of the seventh transistor is electrically connected to the first terminal of the fourth transistor.

6. The driver circuit according to claim 5,
wherein the second protection circuit comprises an eighth transistor,
wherein the second terminal of the sixth transistor is electrically connected to the second power supply line through the eighth transistor,
wherein a first terminal of the eighth transistor is electrically connected to the second terminal of the sixth transistor, and
wherein a second terminal of the eighth transistor is electrically connected to the second power supply line and a gate of the eighth transistor.

7. A display device comprising the driver circuit according to claim 6.

* * * * *